(12) United States Patent
Chen et al.

(10) Patent No.: US 11,626,343 B2
(45) Date of Patent: Apr. 11, 2023

(54) SEMICONDUCTOR DEVICE WITH ENHANCED THERMAL DISSIPATION AND METHOD FOR MAKING THE SAME

(71) Applicant: TAIWAN SEMICONDUCTOR MANUFACTURING CO., LTD., Hsinchu (TW)

(72) Inventors: Yang-Che Chen, Hsinchu (TW); Chen-Hua Lin, Douliu (TW); Huang-Wen Tseng, Zhubei (TW); Victor Chiang Liang, Hsinchu (TW); Chwen-Ming Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/665,783

(22) Filed: Oct. 28, 2019

(65) Prior Publication Data

US 2020/0135613 A1      Apr. 30, 2020

Related U.S. Application Data

(60) Provisional application No. 62/753,042, filed on Oct. 30, 2018.

(51) Int. Cl.
*H01L 23/373*    (2006.01)
*H01L 23/00*     (2006.01)
*H01L 23/367*    (2006.01)

(52) U.S. Cl.
CPC ...... *H01L 23/3736* (2013.01); *H01L 23/3675* (2013.01); *H01L 24/13* (2013.01);
(Continued)

(58) Field of Classification Search
CPC ..... H01L 23/3736; H01L 24/13; H01L 24/32; H01L 24/73; H01L 24/92; H01L 23/3675;
(Continued)

(56) References Cited

U.S. PATENT DOCUMENTS

| 5,881,945 A | 3/1999 | Edwards et al. |
| 6,218,730 B1 | 4/2001 | Toy et al. |

(Continued)

FOREIGN PATENT DOCUMENTS

| CN | 1226746 A | 8/1999 |
| CN | 1259766 A | 7/2000 |

(Continued)

OTHER PUBLICATIONS

Mark Lapedus, "Fan-Out Wars Begin", Semiconductor Engineering, [online] Available: https://semiengineering.com/fan-out-wars-begin/ (Feb. 5, 2018).

(Continued)

*Primary Examiner* — Edward Chin
(74) *Attorney, Agent, or Firm* — McDermott Will & Emery LLP

(57) ABSTRACT

A method includes forming a solder layer on a surface of one or more chips. A lid is positioned over the solder layer on each of the one or more chips. Heat and pressure are applied to melt the solder layer and attach each lid to a corresponding solder layer. The solder layer has a thermal conductivity of $\geq 50$ W/mK.

20 Claims, 31 Drawing Sheets

(52) U.S. Cl.
CPC .............. *H01L 24/14* (2013.01); *H01L 24/16* (2013.01); *H01L 24/32* (2013.01); *H01L 24/33* (2013.01); *H01L 24/73* (2013.01); *H01L 24/92* (2013.01); *H01L 2224/13144* (2013.01); *H01L 2224/13155* (2013.01); *H01L 2224/14181* (2013.01); *H01L 2224/14519* (2013.01); *H01L 2224/16225* (2013.01); *H01L 2224/16501* (2013.01); *H01L 2224/32225* (2013.01); *H01L 2224/32245* (2013.01); *H01L 2224/32505* (2013.01); *H01L 2224/33181* (2013.01); *H01L 2224/33519* (2013.01); *H01L 2224/73153* (2013.01); *H01L 2224/73204* (2013.01); *H01L 2224/73253* (2013.01); *H01L 2224/83203* (2013.01); *H01L 2224/83815* (2013.01); *H01L 2224/92225* (2013.01)

(58) Field of Classification Search
CPC ......... H01L 24/33; H01L 24/16; H01L 24/14; H01L 2224/92225; H01L 2224/73253; H01L 2224/32225; H01L 2224/73153; H01L 2224/13144; H01L 2224/13155; H01L 2224/14181; H01L 2224/14519; H01L 2224/33181; H01L 2224/32245; H01L 2224/16225; H01L 2224/73204; H01L 2224/33519; H01L 2224/32505; H01L 2224/16501; H01L 2224/83203; H01L 2224/83815; H01L 2924/15311; H01L 24/96; H01L 24/97; H01L 24/03; H01L 24/06; H01L 24/11; H01L 2924/16152; H01L 2224/73104; H01L 2224/9212; H01L 2224/83104; H01L 2224/16106; H01L 24/83; H01L 2224/11464; H01L 2224/11424; H01L 2224/16245; H01L 2224/14131; H01L 2224/05073; H01L 2224/13014; H01L 2224/03616; H01L 2224/92; H01L 2224/0345; H01L 2224/03452; H01L 2224/03462; H01L 2224/03464; H01L 2224/131; H01L 24/29; H01L 2224/291; H01L 2224/28105; H01L 2224/81203; H01L 2224/32106; H01L 2224/81815; H01L 24/81; H01L 2224/96; H01L 2224/97; H01L 2224/05554; H01L 2224/06131; H01L 2224/04105; H01L 2224/12105; H01L 2224/03002; H01L 2224/11002; H01L 24/05; H01L 23/4275; H01L 23/3737; H01L 23/42; H01L 23/373; H01L 21/50
See application file for complete search history.

(56) References Cited

U.S. PATENT DOCUMENTS

| | | | |
|---|---|---|---|
| 6,454,160 B2 | 9/2002 | Gueissaz | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,446,466 B1* | 10/2019 | Milne | H01L 24/30 |
| 10,685,949 B2* | 6/2020 | Aleksov | H05K 1/148 |
| 2003/0080411 A1 | 5/2003 | Baek et al. | |
| 2008/0090405 A1* | 4/2008 | Fitzgerald | B23K 35/286 438/612 |
| 2011/0147916 A1 | 6/2011 | Su | |
| 2011/0310562 A1 | 12/2011 | Strader et al. | |
| 2013/0049229 A1* | 2/2013 | Su | H01L 21/54 257/777 |
| 2013/0341786 A1* | 12/2013 | Hsu | H01L 23/49811 257/737 |
| 2015/0108628 A1 | 4/2015 | Yu et al. | |
| 2015/0179607 A1 | 6/2015 | Ho et al. | |
| 2015/0187679 A1 | 7/2015 | Ho et al. | |
| 2015/0214128 A1 | 7/2015 | Lin et al. | |
| 2015/0305189 A1* | 10/2015 | Strader | H01L 23/3735 165/185 |
| 2016/0165755 A1* | 6/2016 | Bodenweber | H01L 23/46 165/80.2 |
| 2017/0179103 A1* | 6/2017 | Aleksov | H05K 3/4691 |
| 2018/0166356 A1 | 6/2018 | Butt et al. | |
| 2018/0216248 A1* | 8/2018 | Akbulut | F28F 13/00 |
| 2019/0139901 A1* | 5/2019 | Scanlan | H01L 23/3107 |
| 2019/0148261 A1* | 5/2019 | Wu | H01L 21/4882 257/684 |
| 2019/0371700 A1* | 12/2019 | Yeh | H01L 23/3737 |
| 2020/0013691 A1* | 1/2020 | Liu | G01N 29/24 |
| 2020/0105731 A1* | 4/2020 | Aleksov | H01L 24/83 |
| 2020/0135613 A1* | 4/2020 | Chen | H01L 23/3736 |
| 2021/0028051 A1* | 1/2021 | Noma | H01L 24/742 |
| 2021/0313248 A1* | 10/2021 | Arora | H05K 1/0203 |

FOREIGN PATENT DOCUMENTS

| | | |
|---|---|---|
| CN | 1305944 A | 8/2001 |
| CN | 102668075 A | 9/2012 |
| CN | 106537582 A | 3/2017 |
| JP | 2001-298131 A | 10/2001 |
| KR | 10-2009-0037497 A | 4/2009 |
| KR | 10-2010-0058168 A | 6/2010 |
| KR | 10-2013-0020832 A | 2/2013 |
| TW | 200831680 A | 8/2008 |
| TW | 201601358 A | 1/2016 |
| TW | 201830606 A | 8/2018 |
| WO | 2008/042178 A1 | 4/2008 |

OTHER PUBLICATIONS

Jim Wilson, "Thermal Conductivity of Solders", [online] Available: https://www.electronics-cooling.com/2006/08/thermal-conductivity-of-solders/ (Aug. 1, 2006).

* cited by examiner

SEMICONDUCTOR DEVICE WITH ENHANCED THERMAL DISSIPATION AND METHOD FOR MAKING THE SAME

RELATED APPLICATION

This application claims priority to U.S. Provisional Patent Application No. 62/753,042 filed Oct. 30, 2018, the entire content of which is incorporated herein by reference.

BACKGROUND

Thermal dissipation in an advanced package is becoming more and more challenging as the power consumption exceeds 500 W, especially in high performance and artificial intelligence applications. The conventional approach is to use a thermal interface material (TIM) between a chip and the lid to enhance thermal dissipation. The thermal conductivity of conventional thermal interface material is typically less than 10 W/mK, which may limit the operation power of a package to less than 500 W.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
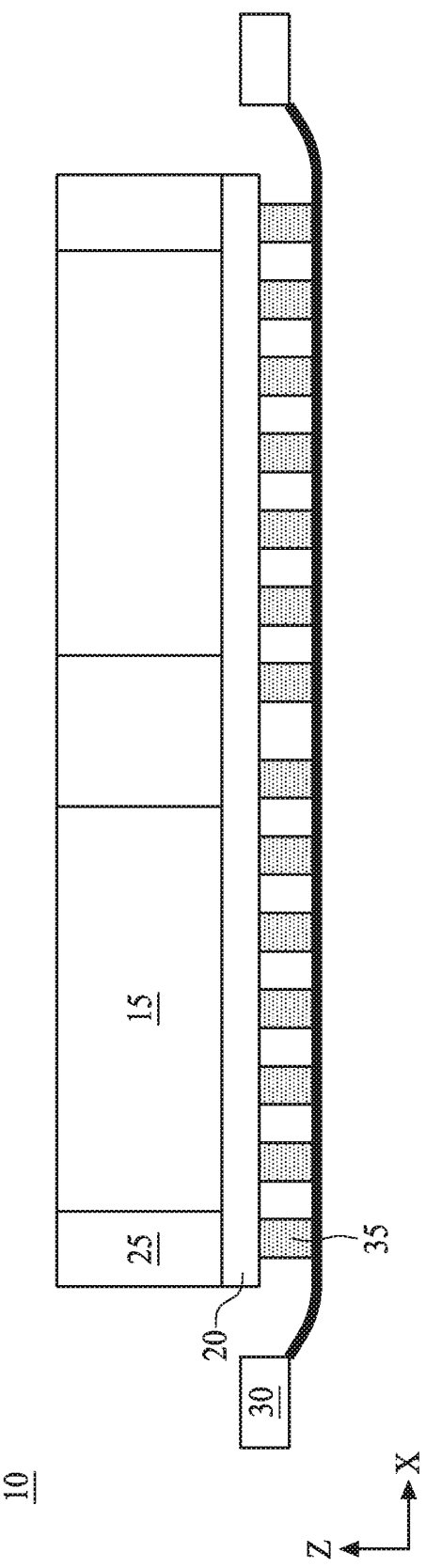
FIG. 1 illustrates a sequential step of manufacturing a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

It is desirable to increase the thermal conductivity of thermal interface material to greater than 10 W/mK in order to operate semiconductor device packages at greater than 500 W. Embodiments of the present disclosure use materials containing high thermal conductivity metals e.g.—Cu ($K_{Cu}$~400 W/mK) and Sn ($K_{Sn}$~65 W/mK) to provide a thermal interface material having thermal conductivities which are superior to a conventional thermal interface material (<10 W/mK). By using high thermal conductivity materials between the chip and the lid, the operation power and performance can be significantly increased.

FIGS. 1-9 illustrate a method 10 including sequential steps of manufacturing a semiconductor device according to an embodiment of the present disclosure. As shown in FIG. 1, a semiconductor device, such as an integrated fan out (InFO) wafer on a frame is provided. The InFO wafer includes a plurality of chips 15, such as systems on a chip (SOC) disposed on a redistribution layer 20 and embedded in a molding 25, such as a thermoset resin. The InFO wafer is disposed on a frame 30 via metal pillars or solder bumps 35. In some embodiments, the chip 15 is an integrated fan-out chip, system on a chip, wafer-level chip scale package, or chip on wafer on substrate.

In some embodiments, the redistribution layer 20 is formed with one or more metal layers and one or more intermetal dielectric layers. The intermetal dielectric layers are disposed between the metal layers. The intermetal dielectric layers have conductive features such as vias disposed in a dielectric material connecting to conductive features such as traces in the metal layers. In some embodiments, the dielectric material of the metal layers and intermetal dielectric layers is, for example, a silicon oxide, nitride, carbide, polymer, or another insulating or dielectric material, and may be formed using a chemical vapor deposition (CVD), spin-on or other deposition process. The conductive features may be formed using a damascene or dual damascene process, with openings etched in the dielectric layer of the redistribution layer 20, and a conductive material such as copper, aluminum, or the like deposited in the opening and then planarized. The redistribution layer is built up by forming multiple metal layers and intermetal dielectric layers, with the traces and vias routing electrical connections from structures on the substrate 50 on which the chip 15 will be subsequently disposed (see FIG. 5) to the top surface of the redistribution layer 20.

Figure 2:
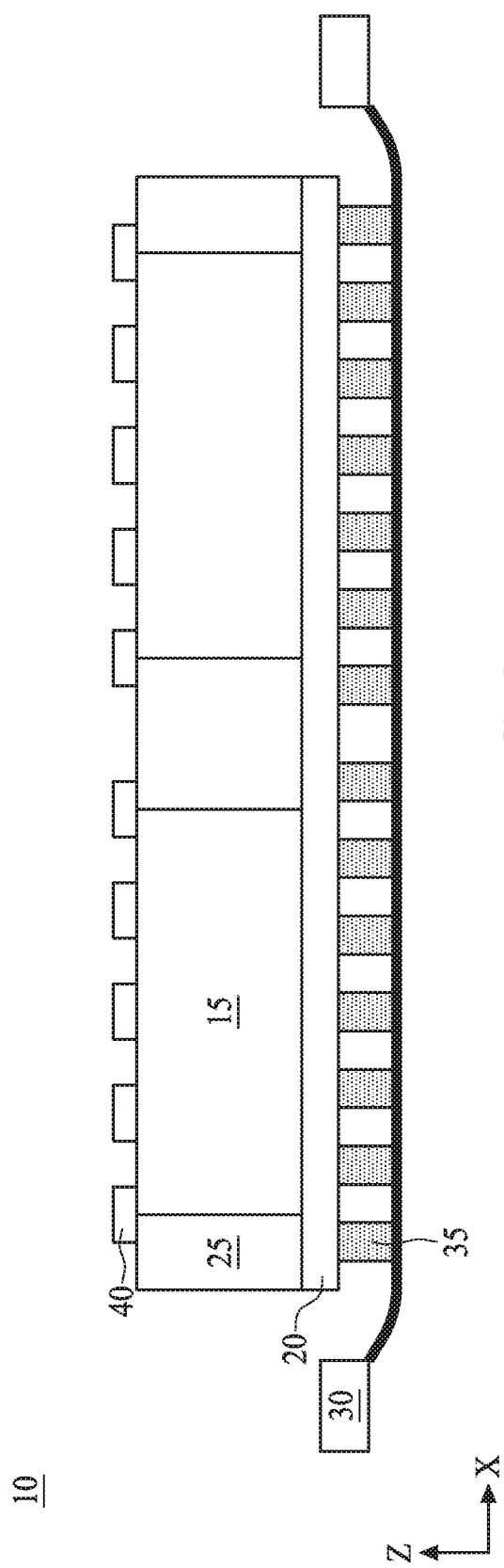
FIG. 2 illustrates a sequential step of manufacturing a semiconductor device according to an embodiment of the present disclosure.
Figure 3A:
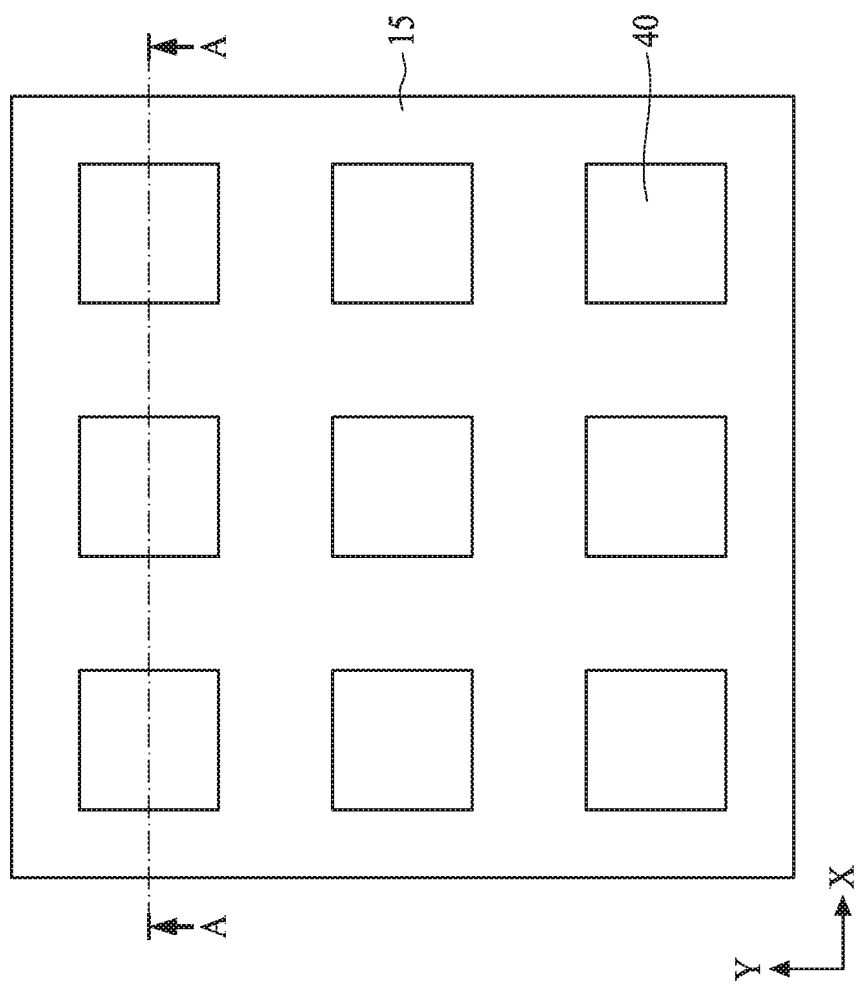
FIGS. 3A and 3B illustrate a sequential step of manufacturing a semiconductor device according to an embodiment of the present disclosure.
Figure 3B:
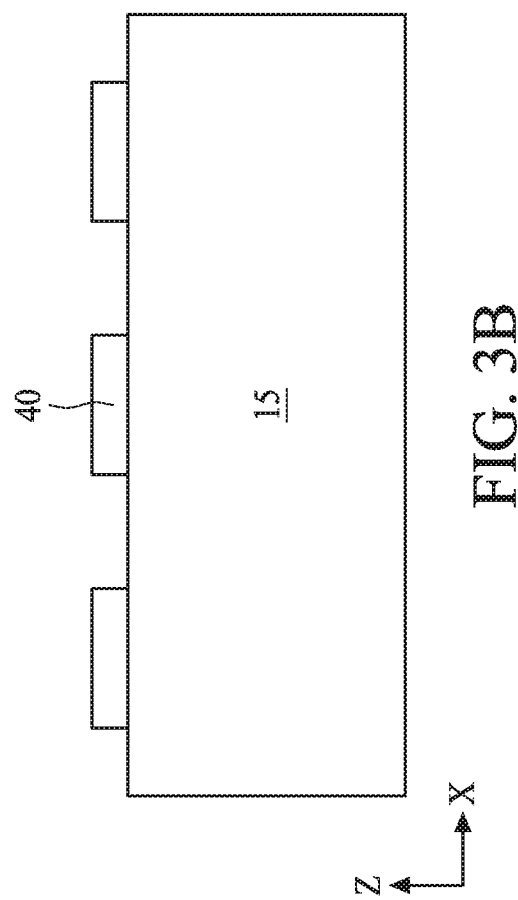

A pattern of bonding pads 40 are formed on the chip surface, as shown in FIG. 2. In some embodiments, the bonding pads 40 are formed as a pattern of spaced-apart regions. In some embodiments, bonding pads 40 are formed on the surface of the chip 15, as shown in FIGS. 3A and 3B. FIG. 3A is a plan view of the device 15 and FIG. 3B is a cross section view of the device 15 taken along line A-A of FIG. 3A. In some embodiments, the bonding pads 40 are formed in an array on the surface of the chip 15. In some embodiments, the bonding pads 40 are formed of a suitable conductive metal, including aluminum, copper, silver, gold, nickel, tungsten, titanium, alloys thereof, and/or multilayers thereof. The bonding pads 40 are formed by a suitable metal deposition operation, including electro or electroless plating, physical vapor deposition (PVD) including sputtering, chemical vapor deposition (CVD), atomic layer deposition (ALD), thermal evaporation, or electron beam evaporation.

Figure 4:
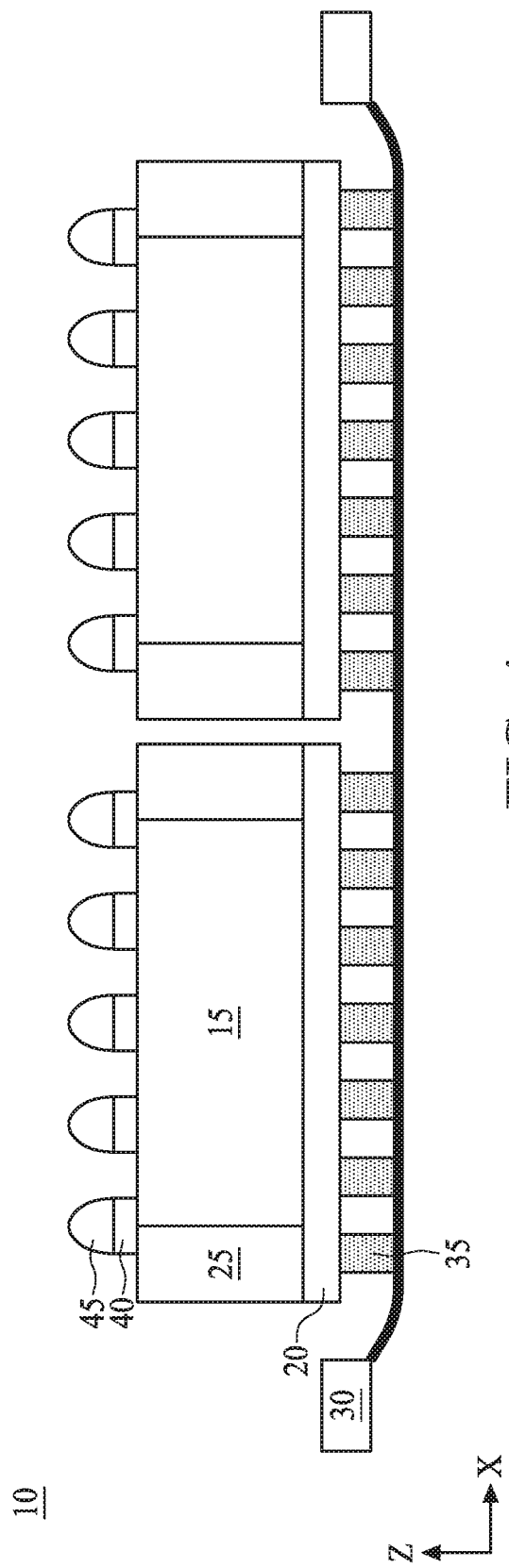
FIG. 4 illustrates a sequential step of manufacturing a semiconductor device according to an embodiment of the present disclosure.

Then, a solder layer 45 is formed over each of the bonding pads 40, respectively, as shown in FIG. 4. The solder layer 45 is formed as solder balls in this embodiment. In some embodiments, the solder layer 45 is made of a tin-containing alloy, such as PbSn, AgSn, SnAgCu, CuSnNi, AgCuSbSn, AuSn, or CuSn. In some embodiments, the PbSn solder has a thermal conductivity of about 50 W/mK, the AgSn solder has a thermal conductivity of about 78 W/mK, the SnAgCu solder has a thermal conductivity of about 60 W/mK, the CuSnNi has a thermal conductivity of about 64 W/mK, the AgCuSbSn solder has a thermal conductivity of about 57 W/mK, the AuSn solder has a thermal conductivity of about 57 W/mK, and the CuSn solder has a thermal conductivity of about 65 W/mK. In some embodiments, individual chips 15 are separated by a sawing operation before or after the solder layer 45 is formed.

Figure 5:
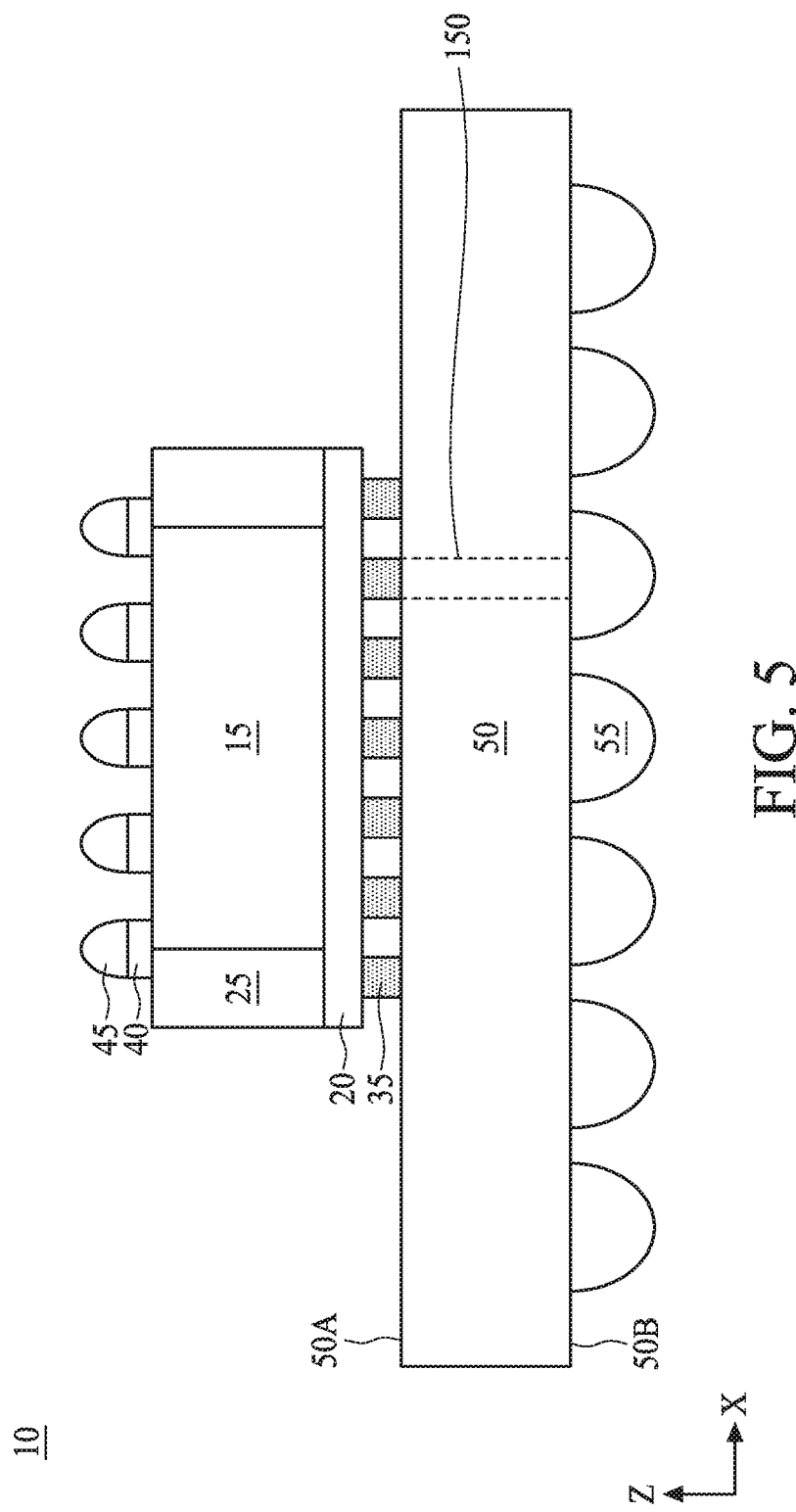
FIG. 5 illustrates a sequential step of manufacturing a semiconductor device according to an embodiment of the present disclosure.

Next, individual chips 15 are removed from the frame 30 and attached to a substrate 50, such as a ball grid array substrate, as shown in FIG. 5. The ball grid array substrate 50 has a first main surface 50A, on which the chip 15 is attached via the solder bumps 35 on the redistribution layer 20, and a second main surface 50B including an array of solder balls 55. In some embodiments, conductive vias 150 or wiring layers are formed in the substrate electrically connecting the solder bumps 35 on the redistribution layer to solder balls on the second main surface 50B of the substrate 50.

Figure 6:
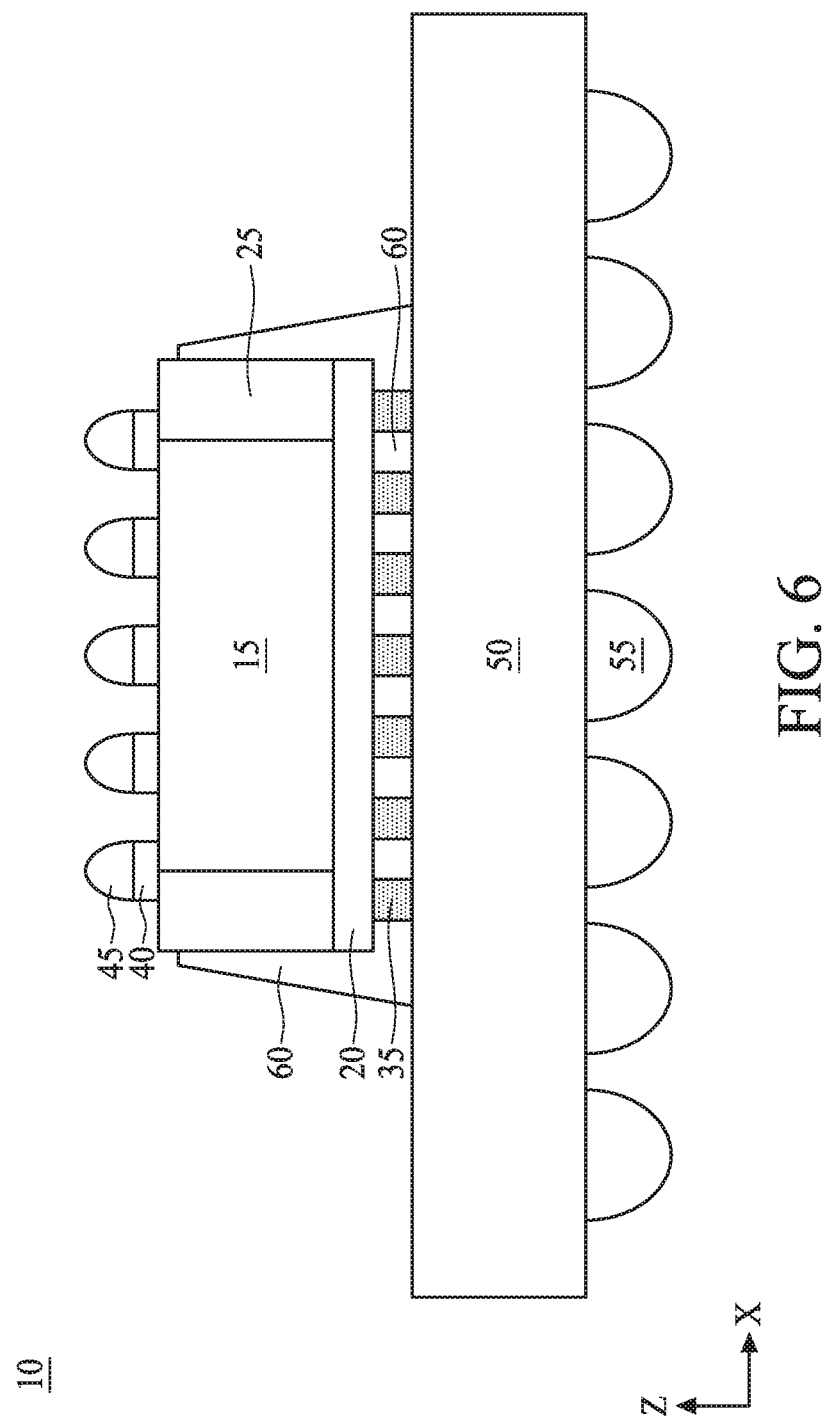
FIG. 6 illustrates a sequential step of manufacturing a semiconductor device according to an embodiment of the present disclosure.

In some embodiments, an underfill material 60 is formed between the chip 15 and the substrate 50, as shown in FIG. 6. The underfill material 60 fills the region between the solder bumps 35 on the redistribution layer 20. In some embodiments, the underfill material 60 is also disposed over the sides of the chip 15. In some embodiments, the underfill material 60 is an epoxy resin, such as a silica filled epoxy resin, a polyimide, or other suitable insulating material. The underfill material 60 increases mechanical reliability by distributing stresses across the top of the ball grid array substrate 50 rather than allowing them to become concentrated in the solder bumps 35. In addition, the underfill material 60 provides encapsulation from moisture and contaminants in the external environment.

Figure 7:
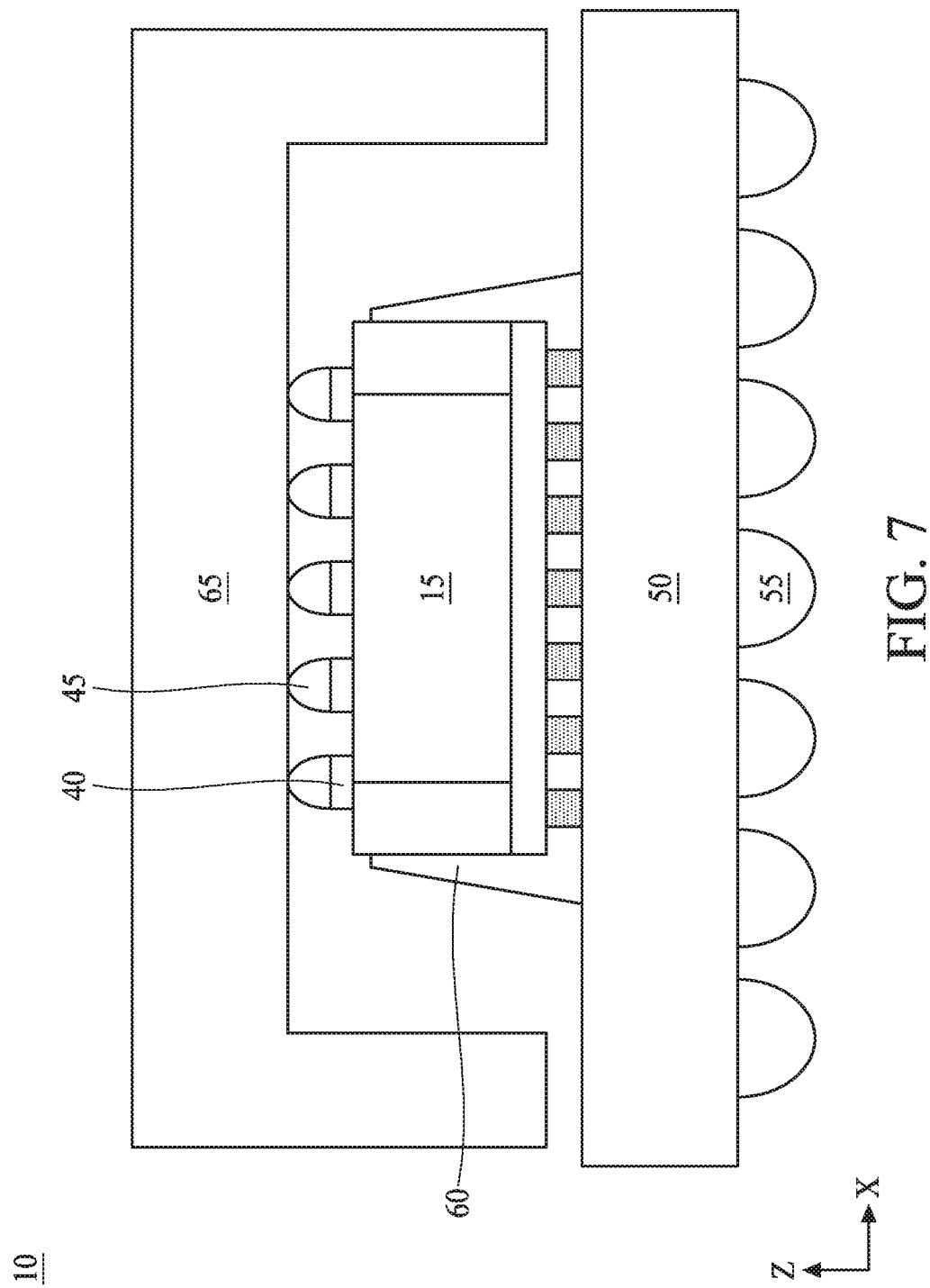
FIG. 7 illustrates a sequential step of manufacturing a semiconductor device according to an embodiment of the present disclosure.

A lid 65 is subsequently positioned over the solder layer 45, as shown in FIG. 7. The lid 65 functions as a heat sink to dissipate heat generated by the chip 15. The lid 65 is made of a heat conductive material. In some embodiments, the lid is made of aluminum, copper, nickel, cobalt, and alloys thereof, or other thermally conductive materials. In some embodiments, the lid is made of a composite material, including silicon carbide, aluminum nitride, graphite, and the like.

Figure 8:
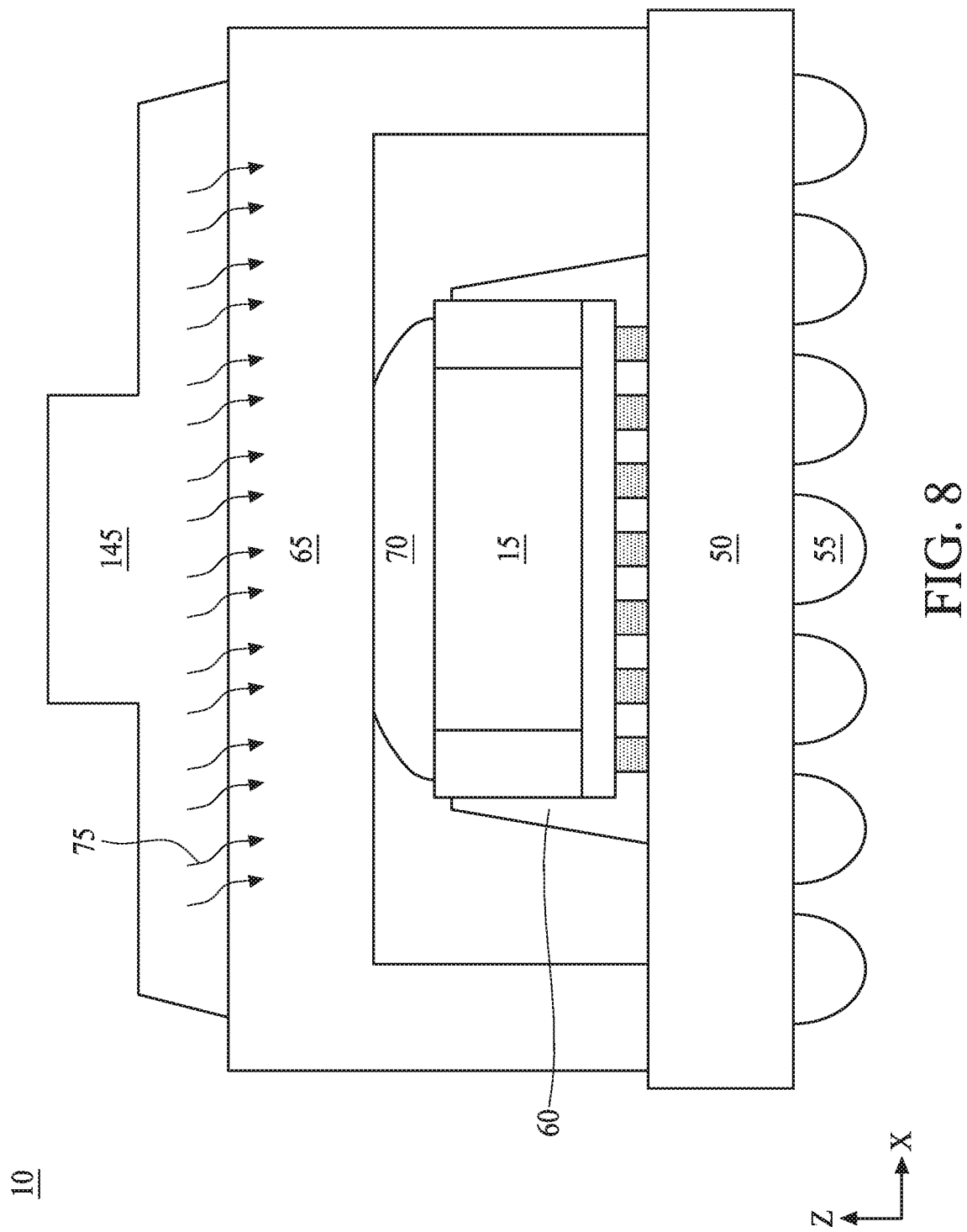
FIG. 8 illustrates a sequential step of manufacturing a semiconductor device according to an embodiment of the present disclosure.
Figure 9:
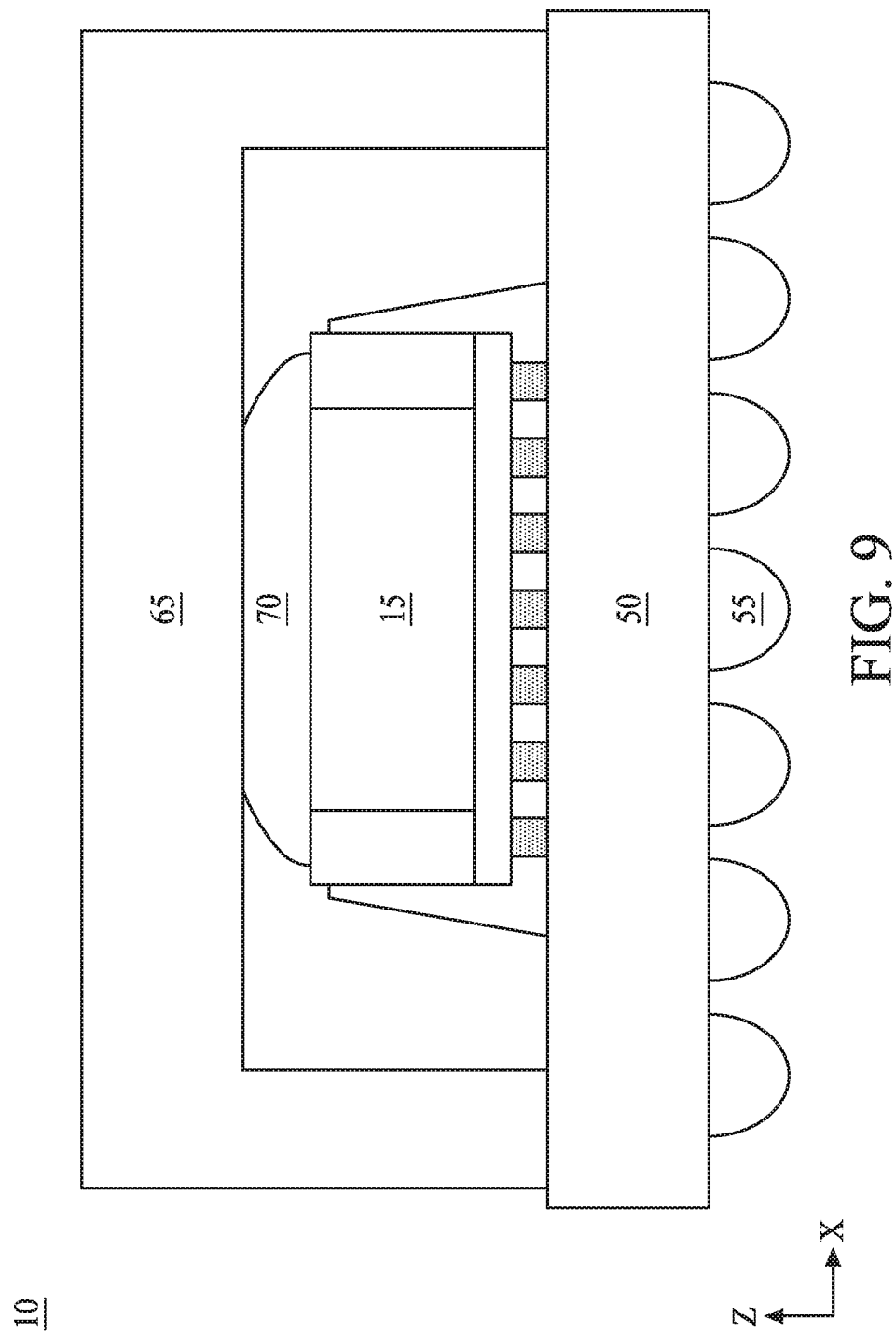
FIG. 9 illustrates a sequential step of manufacturing a semiconductor device according to an embodiment of the present disclosure.

Then, the lid 65 is heated and pressed into intimate contact with the chip 15 via the solder layer 45, such as by using a thermal compressive bond head 145, as shown in FIG. 8, thereby resulting in a semiconductor device with the lid 65 bonded to chip 15, as shown in FIG. 9. During the application of the heat and pressure 75 to the lid 65, the solder layer 45 flows to form a continuous solder layer 70 between the lid 65 and chip 15. In some embodiments, the thermal compressive bond head 145 heats the solder layer 45 to a temperature of about 150° C. to about 400° C. In some embodiments, the solder layer 45 is heated to a temperature of about 200° C. to about 300° C. In an embodiment, the solder layer 45 is heated to a temperature of about 250° C. In some embodiments, the pressure applied while pressing the lid 65 into contact with the chip 15 ranges from about 50 kPa to about 20 MPa. In some embodiments, the pressure applied ranges from about 300 kPa to about 3 MPa. In some embodiments, the pressure applied ranges from about 500 KPa to about 2 MPa. During the application of the heat and pressure, the solder layer 45 flows to surround and encapsulate the bonding pads 40. The continuous solder layer 70 functions as an improved thermal interface material (TIM) layer that has greater thermal conductivity than conventional thermal interface materials. Heat from the chip 15 is transferred to the lid 65 by way of the continuous solder layer 70. The lid 65 dissipates the heat of chip 15, permitting the chip 15 to operate at higher speeds and with less thermal stress.

Figure 10:
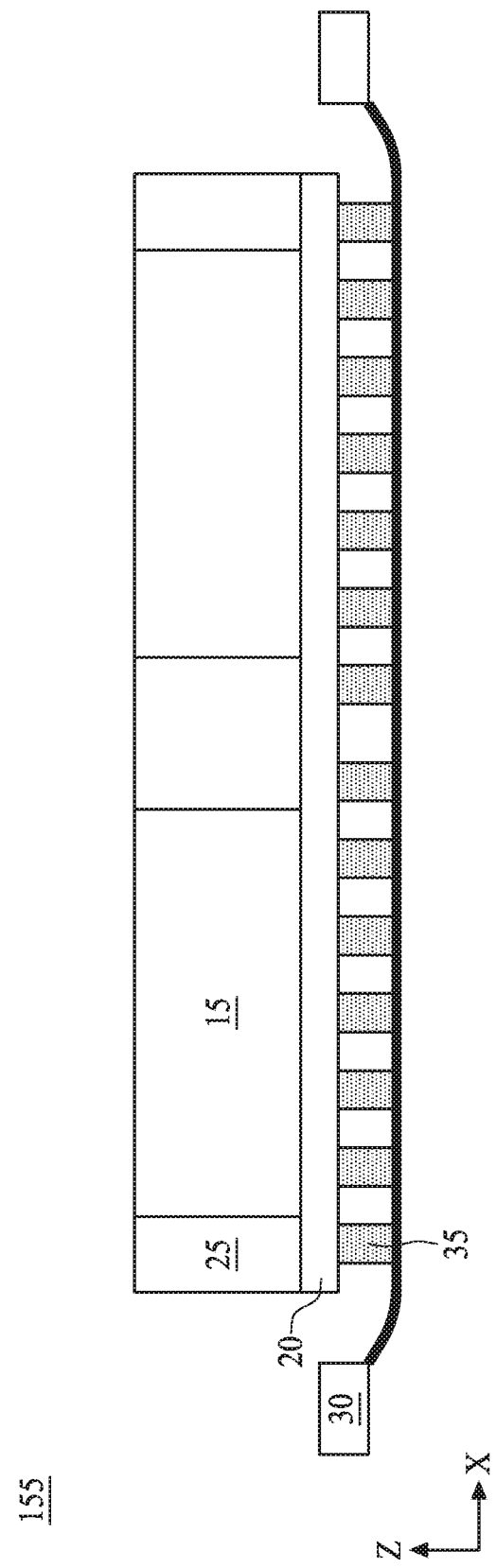
FIG. 10 illustrates a sequential step of manufacturing a semiconductor device according to an embodiment of the present disclosure.

FIGS. 10-17 illustrate a method 155 including sequential steps of manufacturing a semiconductor device according to an embodiment of the present disclosure. As shown in FIG. 10, a semiconductor device, such as an integrated fan out (InFO) wafer on a frame is provided. The operation shown in FIG. 10 is the same as shown in FIG. 1. The InFO wafer includes a plurality of chips 15, such as systems on a chip (SOC) disposed on a redistribution layer 20 and embedded in a molding 25, such as a thermoset resin. The InFO wafer is disposed on a frame 30 via metal pillars or solder bumps 35. In some embodiments, the chip 15 is an integrated fan-out chip, system on a chip, wafer-level chip scale package, or chip on wafer on substrate.

Figure 11:
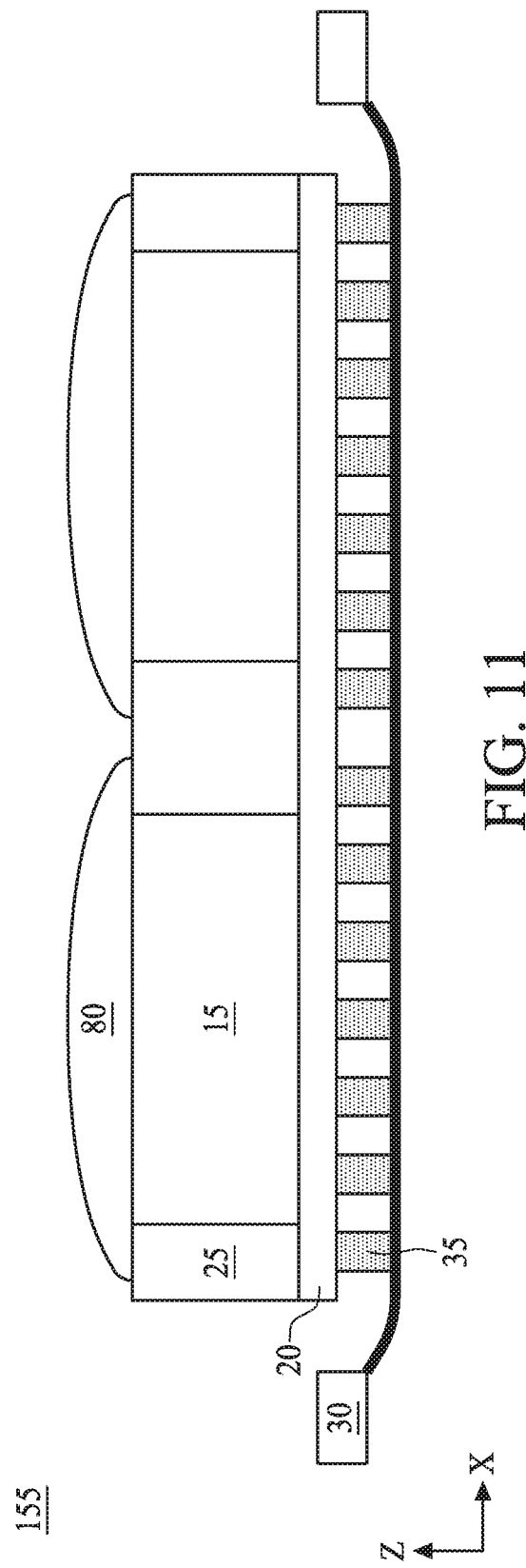
FIG. 11 illustrates a sequential step of manufacturing a semiconductor device according to an embodiment of the present disclosure.
Figure 12:
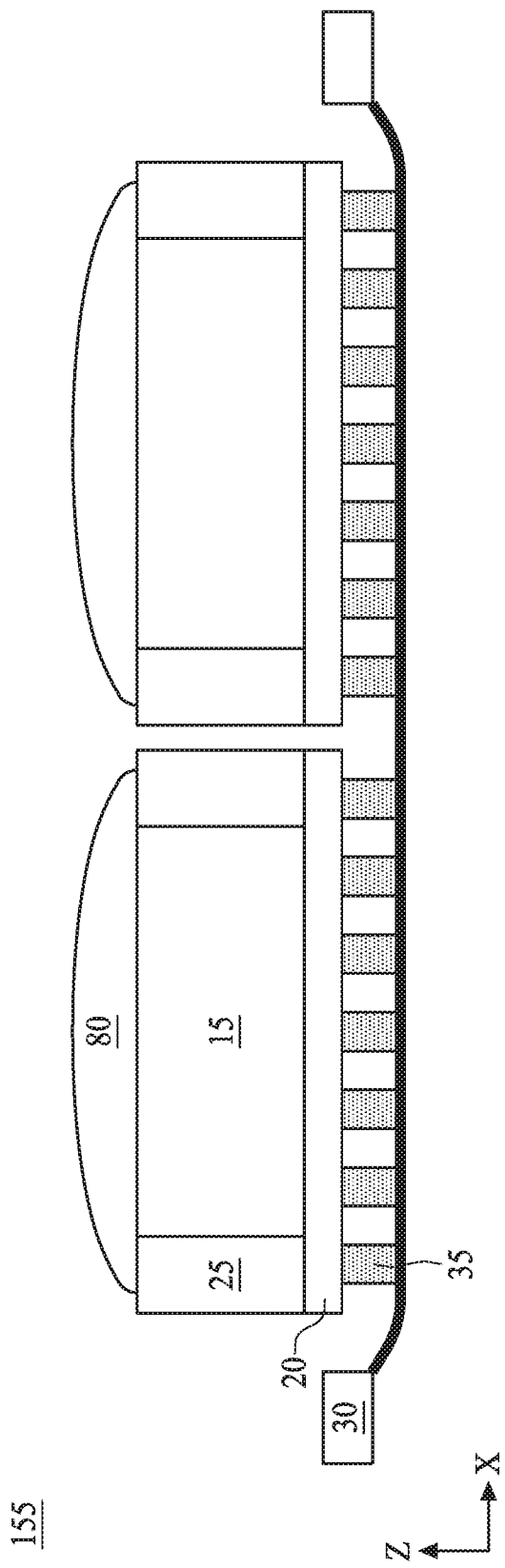
FIG. 12 illustrates a sequential step of manufacturing a semiconductor device according to an embodiment of the present disclosure.

A continuous solder layer 80 is formed directly on the chips, as shown in FIG. 11. In contrast to the prior disclosed method, a plurality of bonding pads are not formed on the upper surface of the chips 15. In some embodiments, the solder layer 45 is made of a tin-containing alloy, such as PbSn, AgSn, SnAgCu, CuSnNi, AgCuSbSn, AuSn, or CuSn. In some embodiments, the PbSn solder has a thermal conductivity of about 50 W/mK, the AgSn solder has a thermal conductivity of about 78 W/mK, the SnAgCu solder has a thermal conductivity of about 60 W/mK, the CuSnNi has a thermal conductivity of about 64 W/mK, the AgCuSbSn solder has a thermal conductivity of about 57 W/mK, the AuSn solder has a thermal conductivity of about 57 W/mK, and the CuSn solder has a thermal conductivity of about 65 W/mK. Then, the individual chips 15 are separated by a sawing operation, as shown in FIG. 12.

Figure 13:
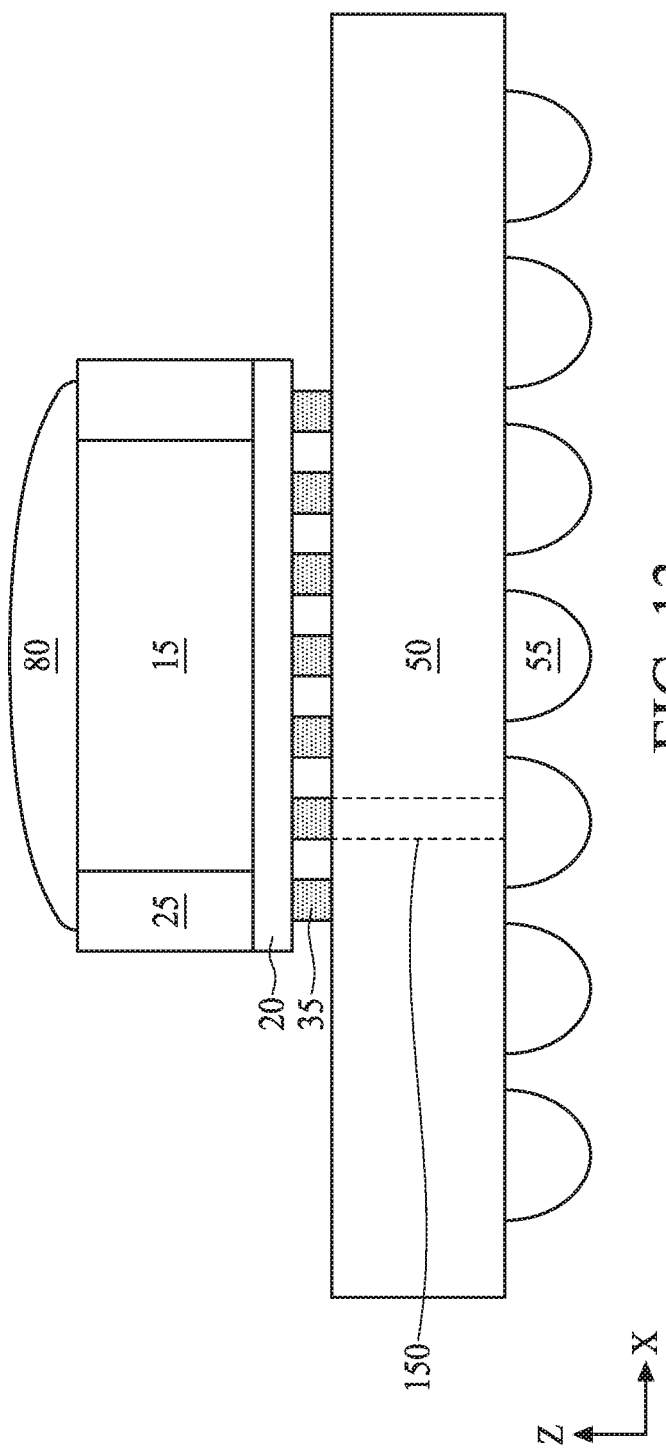
FIG. 13 illustrates a sequential step of manufacturing a semiconductor device according to an embodiment of the present disclosure.

Next, individual chips 15 are removed from the frame 30 and attached to a substrate 50, such as a ball grid array substrate, as shown in FIG. 13. The ball grid array substrate 50 has a first main surface 50A, on which the chip 15 is attached via the solder bumps 35 on the redistribution layer 20, and a second main surface including an array of solder balls 55. In some embodiments, conductive vias 150 or wiring layers are formed in the substrate electrically connecting the solder bumps 35 on the redistribution layer to solder balls on the second main surface 50B of the substrate 50.

Figure 14:
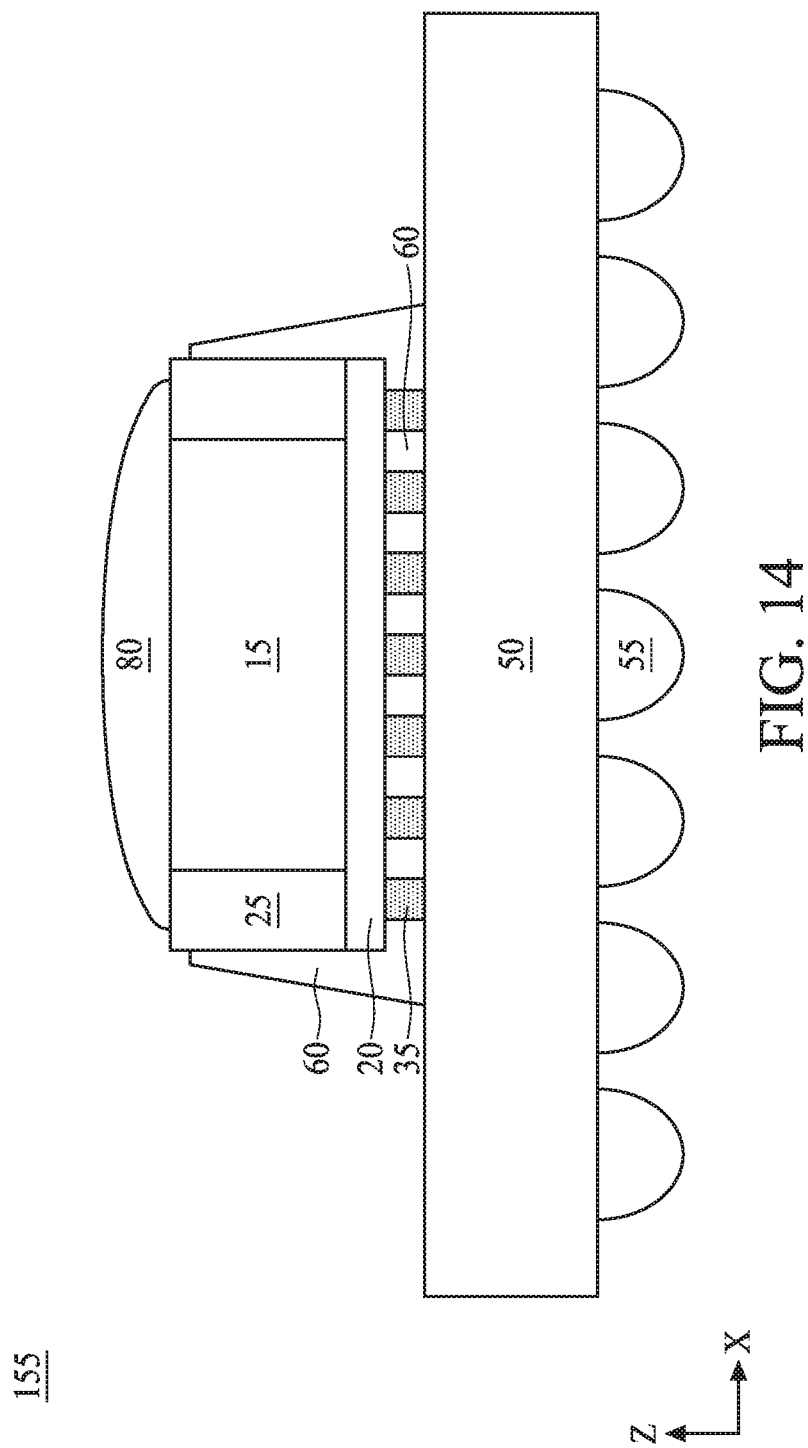
FIG. 14 illustrates a sequential step of manufacturing a semiconductor device according to an embodiment of the present disclosure.

In some embodiments, an underfill material 60 is formed between the chip 15 and the substrate 50, as shown in FIG. 14. The underfill material 60 fills the region between the solder bumps 35 on the redistribution layer 20. In some embodiments, the underfill material 60 is also disposed over the sides of the chip 15. In some embodiments, the underfill material 60 is an epoxy resin, such as a silica filled epoxy resin, a polyimide, or other suitable insulating material. In some embodiments, the underfill material 60 encapsulates the chip.

Figure 15:
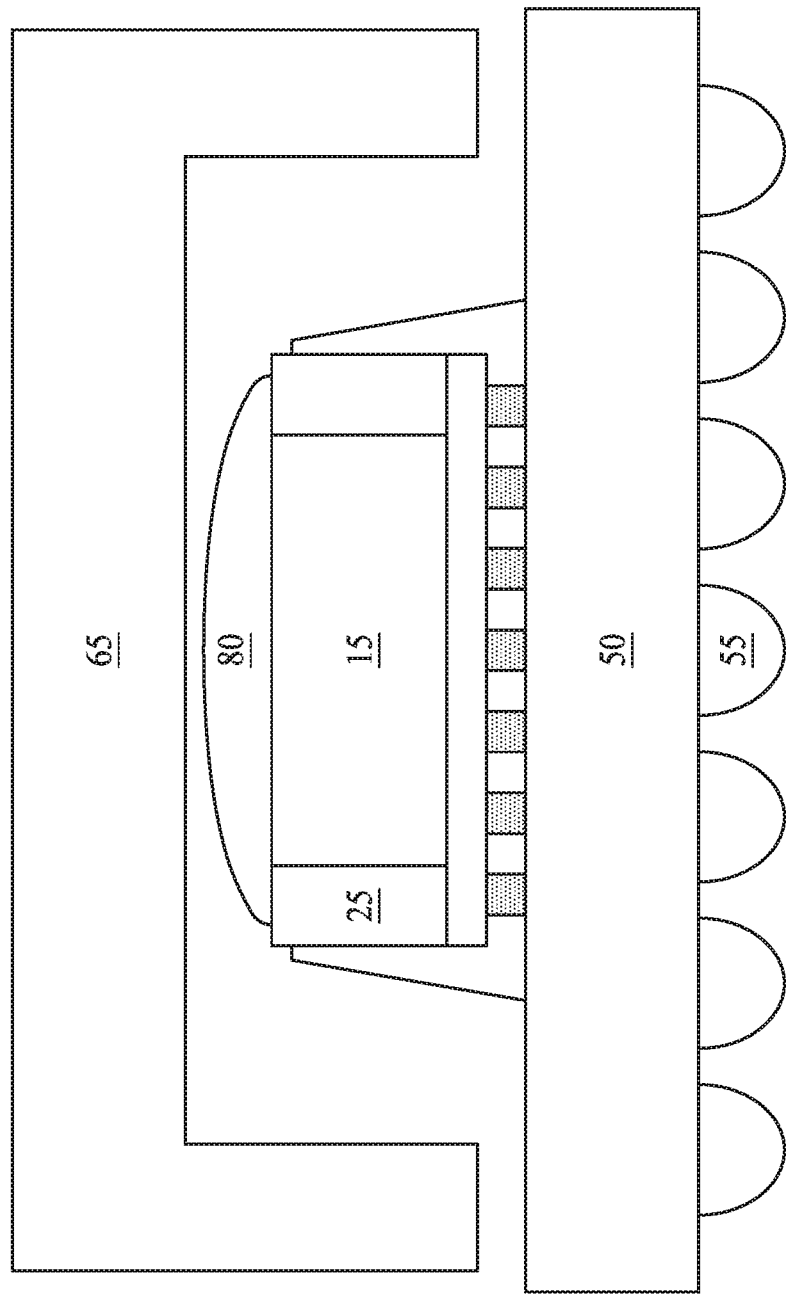
FIG. 15 illustrates a sequential step of manufacturing a semiconductor device according to an embodiment of the present disclosure.

A lid 65 is subsequently positioned over the solder layer 80, as shown in FIG. 15. The lid 65 functions as a heat sink to dissipate heat generated by the chip 15. The lid 65 is made of a heat conductive material. In some embodiments, the lid is made of aluminum, copper, nickel, cobalt, and alloys thereof, or other thermally conductive materials.

Figure 16:
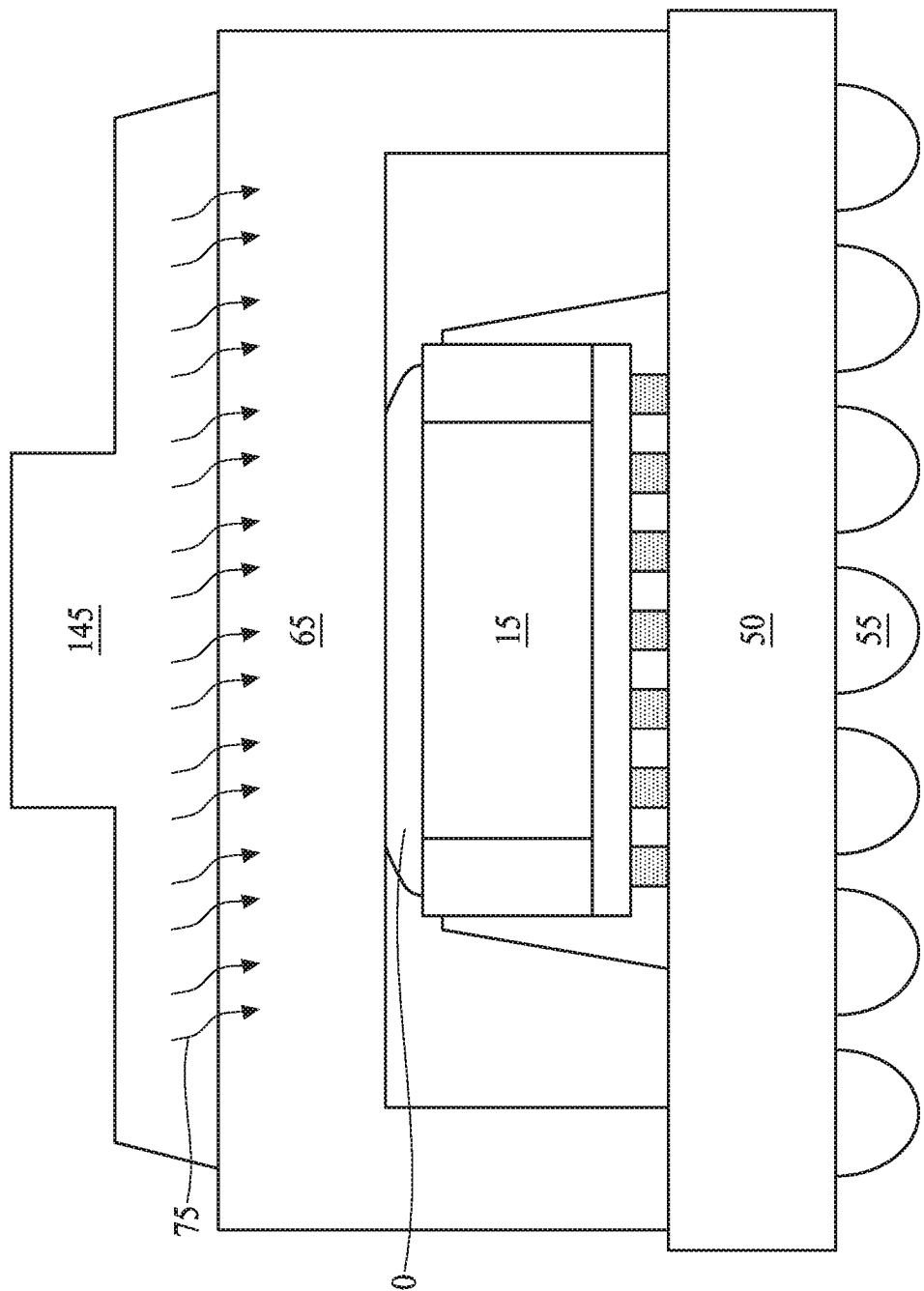
FIG. 16 illustrates a sequential step of manufacturing a semiconductor device according to an embodiment of the present disclosure.
Figure 17:
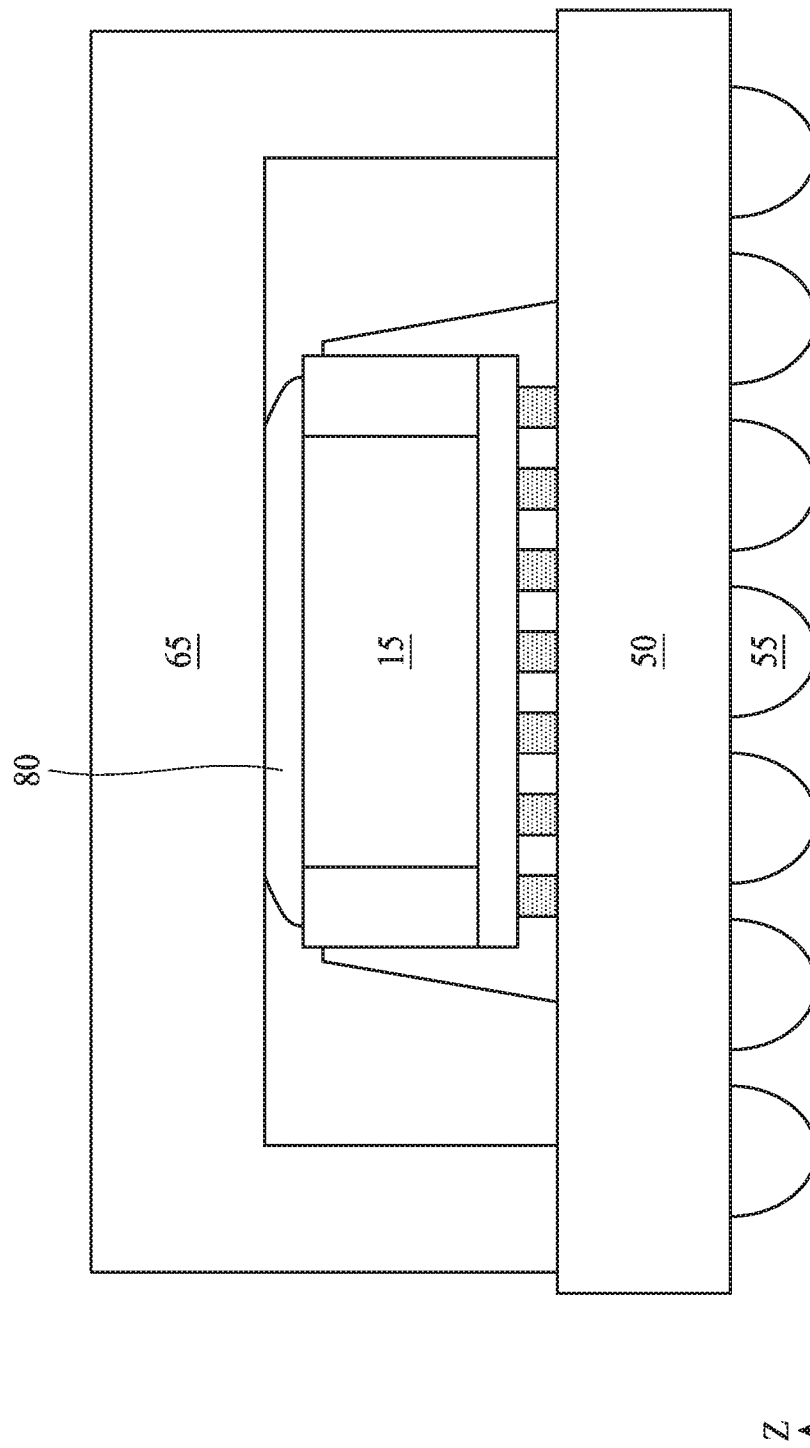
FIG. 17 illustrates a sequential step of manufacturing a semiconductor device according to an embodiment of the present disclosure.

Then, the lid 65 is heated and pressed into intimate contact with the chip 15 via the solder layer 80, such as by using a thermal compressive bond head 145, as shown in FIG. 16, thereby resulting in a semiconductor device with the lid 65 bonded to chip 15, as shown in FIG. 17. In some embodiments, the thermal compressive bond 145 head heats the solder layer 80 to a temperature of about 150° C. to about 400° C. In some embodiments, the solder layer 80 is heated to a temperature of about 200° C. to about 300° C. In an embodiment, the solder layer 80 is heated to a temperature of about 250° C. During the application of the heat and pressure 75 to the lid 65, the solder layer 80 flows, and the solder layer 80 subsequently hardens and fixedly adheres the lid 65 to the chip 15 upon cooling. The solder layer 80 functions as an improved thermal interface material (TIM) layer that has greater thermal conductivity than conventional thermal interface materials. Heat from the chip 15 is transferred to the lid 65 by way of the solder layer 80, thereby permitting the chip 15 to operate at higher speeds and with less thermal stress. In some embodiments, a continuous bonding pad layer is formed on the chip 15 before forming the solder layer 80.

Figure 18:
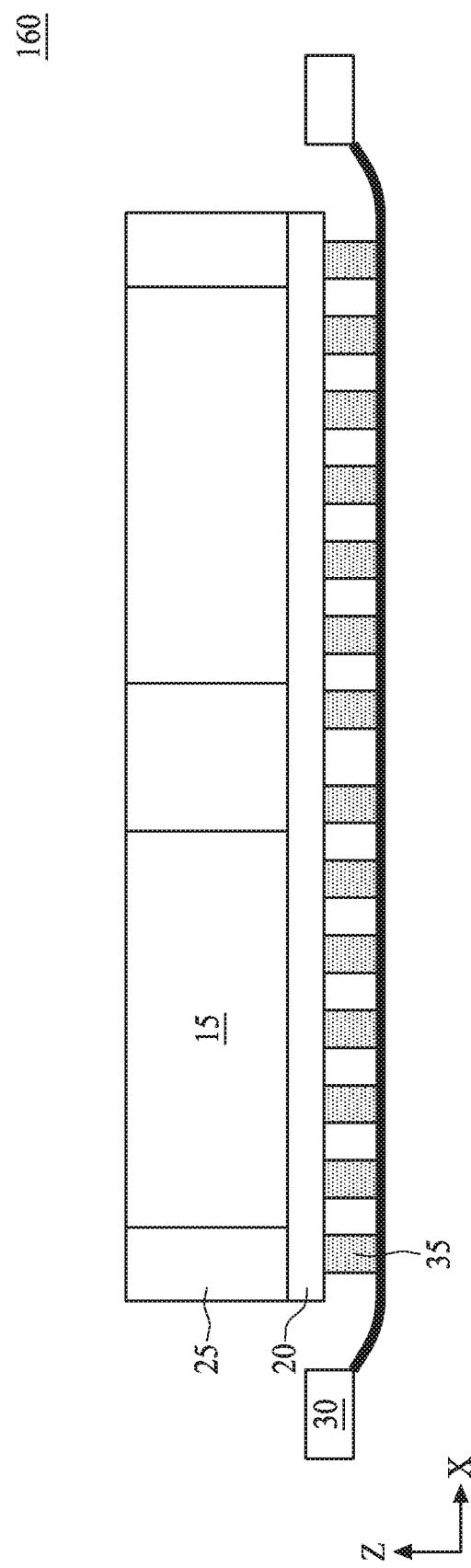
FIG. 18 illustrates a sequential step of manufacturing a semiconductor device according to an embodiment of the present disclosure.

FIGS. 18-28 illustrate a method 160 including sequential steps of manufacturing a semiconductor device according to an embodiment of the present disclosure. As shown in FIG. 18, a semiconductor device, such as an integrated fan out (InFO) wafer on a frame is provided. The operation shown in FIG. 18 is the same as shown in FIGS. 1 and 10. The InFO wafer includes a plurality of chips 15, such as systems on a chip (SOC) disposed on a redistribution layer 20 and embedded in a molding 25, such as a thermoset resin. The InFO wafer is disposed on a frame 30 via metal pillars or solder bumps 35. In some embodiments, the chip 15 is an integrated fan-out chip, system on a chip, wafer-level chip scale package, or chip on wafer on substrate.

Figure 19:
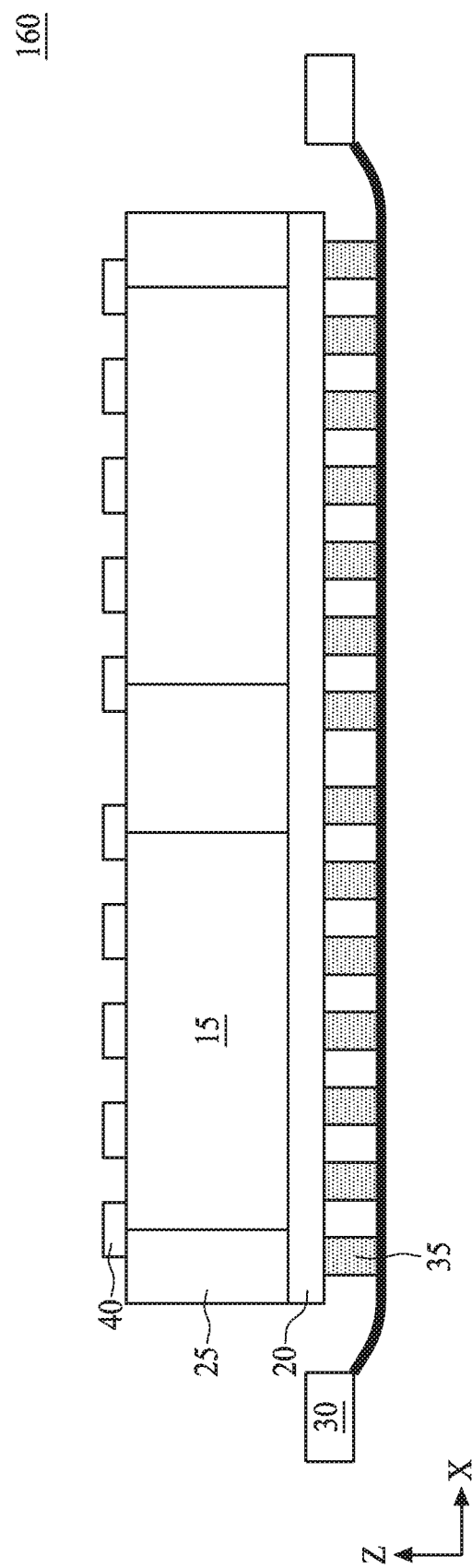
FIG. 19 illustrates a sequential step of manufacturing a semiconductor device according to an embodiment of the present disclosure.

A pattern of bonding pads 40 are formed on the chip surface, as shown in FIG. 19. In some embodiments, the bonding pads 40 are formed as a pattern of spaced-apart regions. In some embodiments, bonding pads 40 are formed on the surface of the chip 15, as shown in FIGS. 3A and 3B. In some embodiments, the bonding pads 40 are formed of a suitable conductive metal, including aluminum, copper, silver, gold, nickel, tungsten, titanium, alloys thereof, and/or multilayers thereof. The bonding pads 40 are formed by a suitable metal deposition operation, including electro or electroless plating, physical vapor deposition (PVD) including sputtering, chemical vapor deposition (CVD), atomic layer deposition (ALD), thermal evaporation, or electron beam evaporation.

Figure 20:
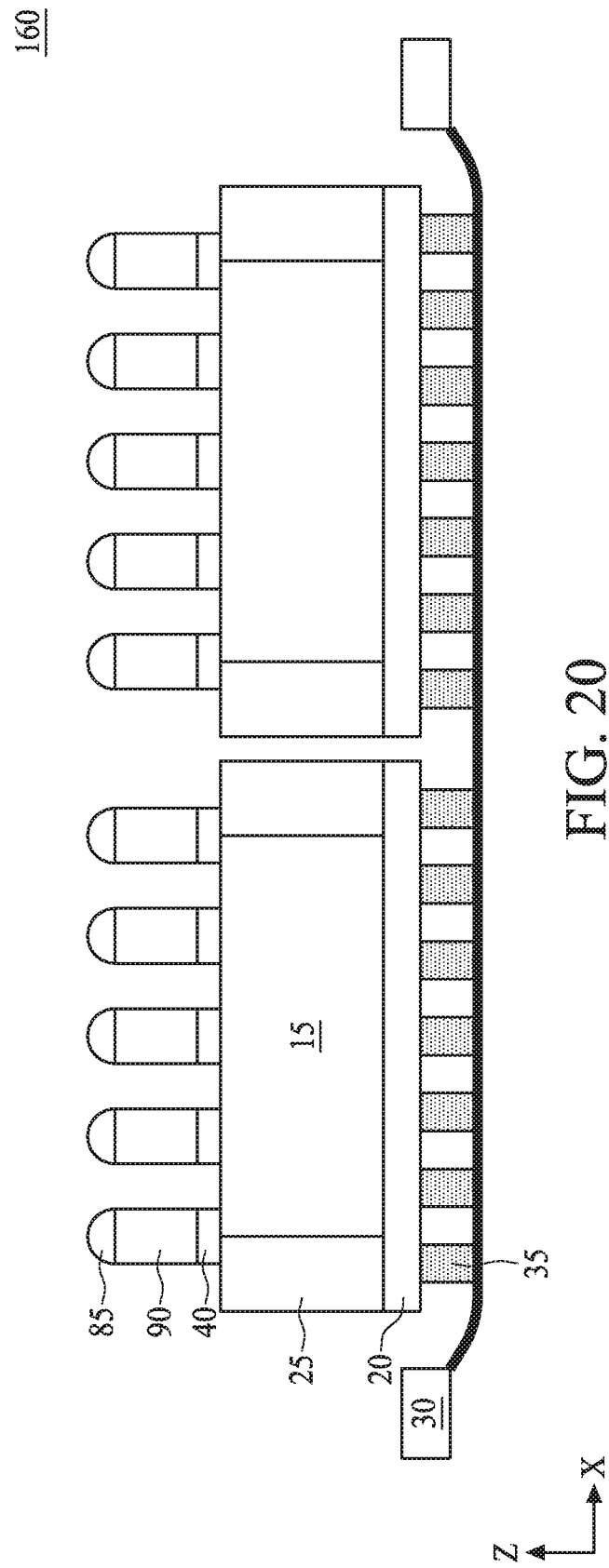
FIG. 20 illustrates a sequential step of manufacturing a semiconductor device according to an embodiment of the present disclosure.

Then spaced-apart conductive pillars 90 are formed over the bonding pads 40, as shown in FIG. 20. In some embodiments, the conductive pillars are formed by a suitable metal deposition operation, including electro or electroless plating, physical vapor deposition (PVD) including sputtering, chemical vapor deposition (CVD), atomic layer deposition (ALD), thermal evaporation, and electron beam evaporation.

A solder layer 85 is subsequently formed over the conductive pillars 90, as shown in FIG. 20. The solder layer 85 includes solder balls or bumps formed over each conductive pillar 90 in some embodiments. In some embodiments, the solder layer 85 is made of a tin-containing alloy, such as PbSn, AgSn, SnAgCu, CuSnNi, AgCuSbSn, AuSn, or CuSn. In some embodiments, the PbSn solder has a thermal conductivity of about 50 W/mK, the AgSn solder has a thermal conductivity of about 78 W/mK, the SnAgCu solder has a thermal conductivity of about 60 W/mK, the CuSnNi has a thermal conductivity of about 64 W/mK, the AgCuSbSn solder has a thermal conductivity of about 57 W/mK, the AuSn solder has a thermal conductivity of about 57 W/mK, and the CuSn solder has a thermal conductivity of about 65 W/mK. In some embodiments, individual chips 15 are separated by a sawing operation before or after the solder layer 80 or conductive pillars 90 are formed, as shown in FIG. 20.

Figure 21:
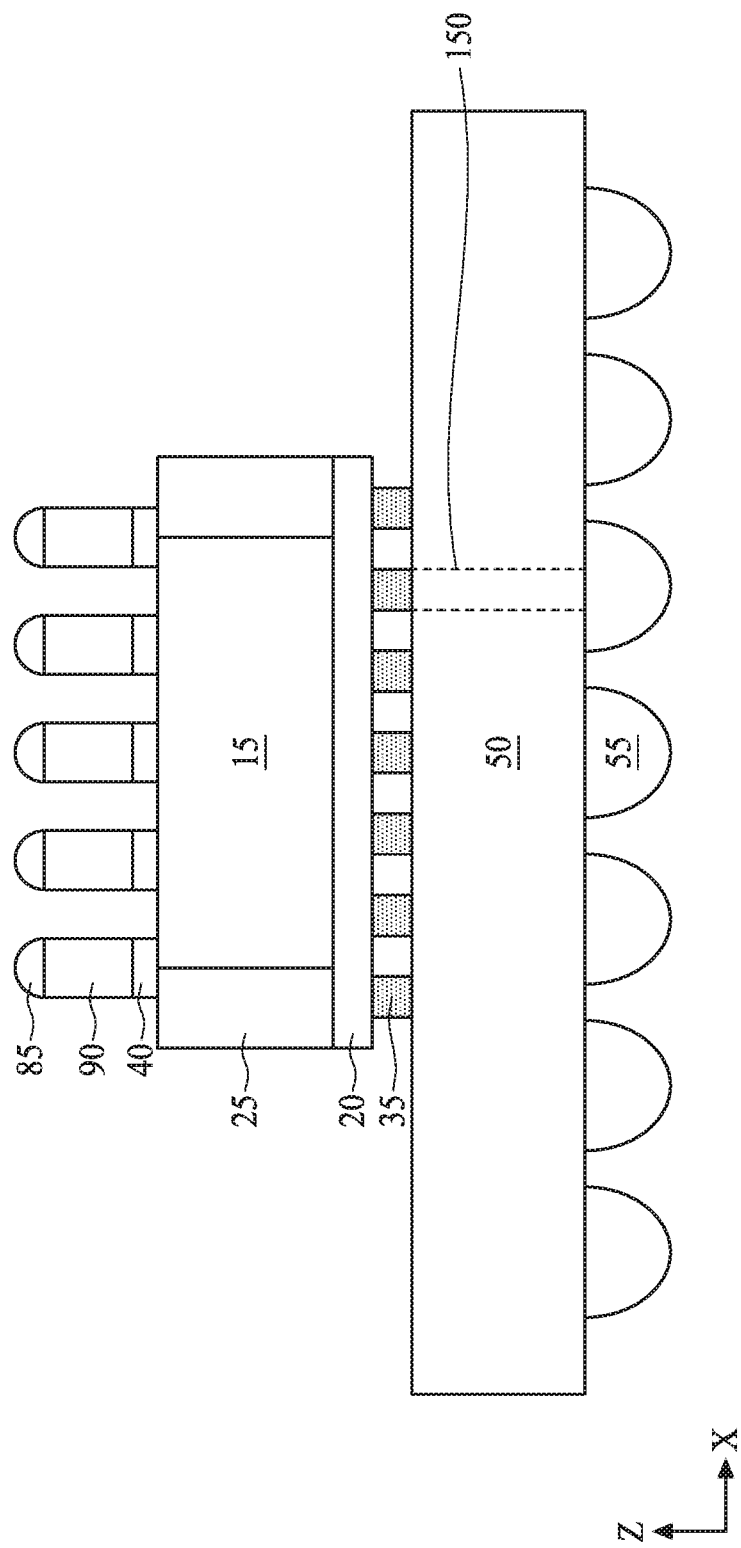
FIG. 21 illustrates a sequential step of manufacturing a semiconductor device according to an embodiment of the present disclosure.

Next, individual chips 15 are removed from the frame 30 and attached to a substrate 50, such as a ball grid array substrate, as shown in FIG. 21. The ball grid array substrate 50 has a first main surface 50A, on which the chip 15 is attached via the solder bumps 35 on the redistribution layer 20, and a second main surface including an array of solder balls 55. In some embodiments, conductive vias 150 or wiring layers are formed in the substrate electrically connecting the solder bumps 35 on the redistribution layer to solder balls on the second main surface 50B of the substrate 50.

Figure 22:
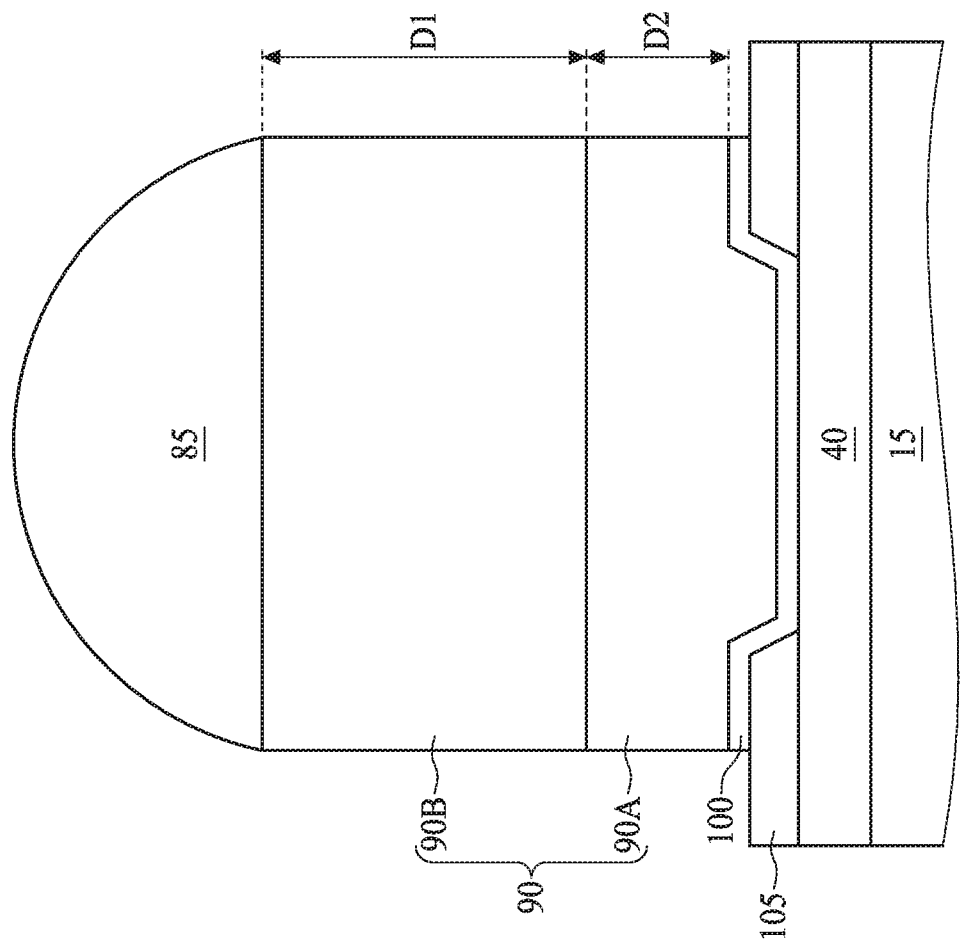
FIG. 22 is a detailed view of a pillar according to an embodiment of the present disclosure.

A detailed schematic view of the conductive pillar is shown in FIG. 22 according to an embodiment of the disclosure. As shown a bonding pad 40 is disposed on a chip 15. In some embodiments, the conductive pillar 90 is made mainly of a metal selected from the group consisting of aluminum, copper, chromium, iron, manganese, magnesium, molybdenum, nickel, niobium, tantalum, titanium, tungsten, zinc, and alloys thereof. In some embodiments, the conductive pillar is made of copper, copper-based material, or a copper alloy. In other embodiments, the conductive pillar 90 is made of nickel, nickel-based material, or a nickel alloy. Copper-based or nickel-based materials include copper or nickel, respectively, in an amount of 50 mol % or greater. A conductive pillar made mainly of a metal is made of 50 mol % or greater of that metal. In some embodiments, the conductive pillar 90 includes only a copper-based material layer or a nickel-based layer. In other embodiments, the conductive pillar 90 includes a first layer 90A mainly made of a metal selected from the group consisting of aluminum, copper, chromium, iron, manganese, magnesium, molybdenum, nickel, niobium, tantalum, titanium, tungsten, zinc, and alloys thereof, and a second metal layer 90B made of another of the metal mainly made of a metal selected from the group consisting of aluminum, copper, chromium, iron, manganese, magnesium, molybdenum, nickel, niobium, tantalum, titanium, tungsten, zinc, and alloys thereof.

In some embodiments, an under bump metallization 100 is disposed on the bonding pad 40 between the conductive pillar 90 and the chip 15. In some embodiments, the under bump metallization is formed by a suitable metal deposition operation, including electro or electroless plating, physical vapor deposition (PVD) including sputtering, chemical vapor deposition (CVD), atomic layer deposition (ALD), thermal evaporation, and electron beam evaporation. In some embodiments, a seed layer (not shown) is deposited on the bonding pad before the under bump metallization is formed. In some embodiments, the under bump metallization 100 extends over the insulating layer 105, and excess under bump metallization is removed by a suitable operation, such as chemical mechanical polishing (CMP).

In an embodiment, the under bump metallization 100 includes a titanium-based layer disposed on the bonding pad 20, and a sputter deposited copper-based layer disposed on the titanium-based layer. A titanium-based material includes titanium, and titanium alloys and titanium compounds containing 50 mol % or greater titanium. A copper-based material includes copper, and copper alloys and copper compounds containing 50 mol % or greater copper. In an embodiment, the titanium-based layer is a sputter-deposited layer of Ti or TiW having a thickness ranging from 20 nm to 70 nm.

In some embodiments, an insulating layer 105 is formed over the chip 15 and surrounding the under bump metallization 100 in some embodiments. In some embodiments, the insulating layer 105 is made of a nitride, an oxide, an oxynitride, a carbide such as silicon carbide, or another material, formed through a deposition, masking and etching process, or through a masking and deposition process. In some embodiments, the insulating layer 105 is made of a polymer, such as polybenzoxazole (PBO), or an epoxy, polyimide, or other material.

In some embodiments, the solder layer 85 is in direct physical contact with an upper surface of the conductive pillar 90. In some embodiments, the solder layer 85 is not in direct physical contact with the conductive pillar 90.

In some embodiments, the conductive pillar 90 has a height D1 ranging from about 1 μm to about 1 mm. In some embodiments, the height D1 of the conductive pillar ranges from 10 μm to about 100 μm. In some embodiments, the height of a second metal layer 90A of the conductive pillar ranges from 0 mm to about 50 μm.

In some embodiments, the conductive pillar 90 has a diameter ranging from about 5 μm to about 50 μm. In some embodiments, the conductive pillar 90 has a diameter ranging from about 10 μm to about 25 μm. In an embodiment, the semiconductor device 10 includes one of a copper-based material layer or nickel based material layer 90A having a height D2 of about 0 μm to about 50 μm between an upper layer 90B of the conductive layer 90 and the upper surface of the under bump metallization 100. In some embodiments, the height D1 of the upper metal layer 90B of the conductive pillar 90 is greater than the height D2 of the lower layer 90A. In some embodiments, a ratio of the height D1 upper metal layer 90B of the conductive pillar 90 to the height D2 of the lower metal layer 90A (D1/D2) ranges from about $1000/1$ to about 1/1. In some embodiments, a ratio of the height D1 of the upper layer of the conductive pillar 90B to the height D2 of the lower metal layer 90A (D1/D2) ranges from about $100/1$ to about $5/1$. In some embodiments, a ratio of the height D1 of the upper layer 90B of the conductive pillar 90 to the height D2 of the lower metal layer 90A (D1/D2) ranges from about $2/1$ to about $10/1$.

Figure 23:
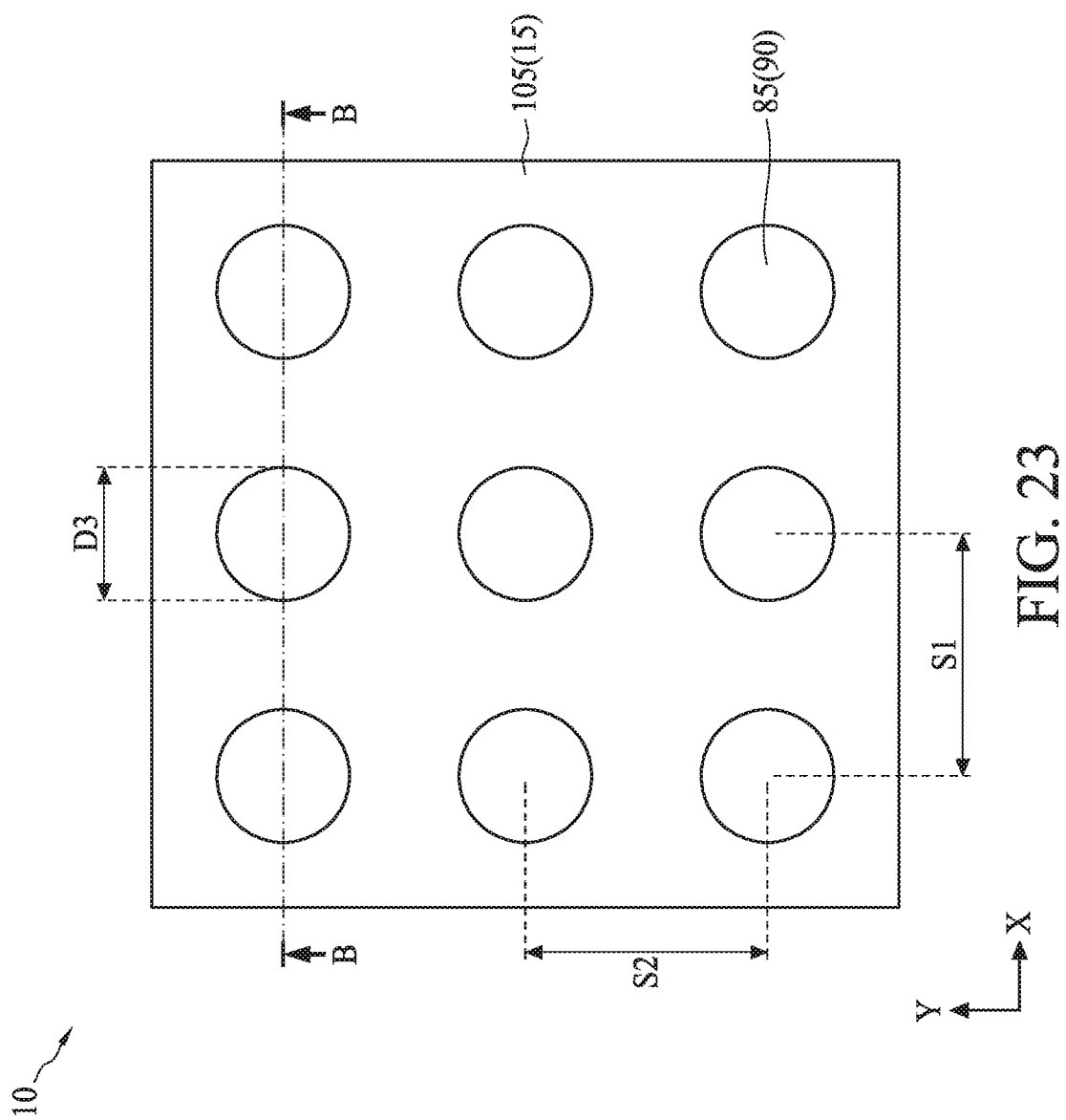
FIG. 23 is a view of an array of pillars according to an embodiment of the present disclosure.

FIG. 23 is a plan view showing a row-column arrangement of the conductive pillars with the solder layer 85 formed thereon on the chip 15. A 3×3 arrangement of conductive pillars 90 is illustrated, but the disclosure is not limited to a 3×3 arrangement. Other arrangements, including fewer or greater number of rows or columns of conductive pillars are included in the scope of this disclosure. For example, the arrangement may be a 10×10 arrangement, or a greater number of column and rows. The arrangement of conductive pillars is not limited to a rectangular arrangement. In some embodiments, other arrangements include staggered rows and columns, where each conductive pillar is immediately adjacent to six other conductive pillars. In other embodiments, the conductive pillars are arranged in a concentric circular arrangement. In other embodiments, the conductive pillars are arranged around the periphery of the chip or in a central portion of the chip. In other embodiments, the conductive pillars are irregularly spaced. In some embodiments, up to about 1,000 conductive pillars are formed on the substrate.

In some embodiments, the conductive pillars 90 have a diameter D3 ranging from about 5 μm to about 50 μm as seen in plan view. In some embodiments, the conductive pillars 90 have a diameter D3 ranging from about 10 μm to about 25 μm. In some embodiments, the plurality of conductive pillars 90 are arranged in a row-column arrangement having a pitch S1 of about 15 am to about a 60 μm from the center of one conductive pillar 90 to the center of an adjacent conductive pillar 90 in the X direction. In some embodiments, the plurality of conductive pillars 90 have a pitch S1 of about 25 μm to about 50 μm from the center of one conductive pillar 90 to the center of an adjacent conductive pillar 90 in the X direction. In some embodiments, the plurality of conductive pillars 90 have a pitch S2 of about 15 μm to about 60 μm from the center of one conductive pillar 90 to the center of an adjacent conductive pillar 90 in the Y direction. In some embodiments, the plurality of conductive pillars 90 have a pitch S2 of about 25 μm to about 50 μm from the center of one conductive pillar 90 to the center of an adjacent conductive pillar 90 in the Y direction.

In some embodiments, a ratio of the diameter D3 of the conductive pillar to the pitch S1 in the X direction ranges from about 1/12 to about 5/6. In some embodiments, a ratio of the diameter D3 of the conductive pillar to the pitch S1 in the X direction ranges from about 1/3 to about 2/3. In some embodiments, a ratio of the diameter D3 of the conductive pillar to the pitch S2 in the Y direction ranges from about 1/12 to about 5/6. In some embodiments, a ratio of the diameter D3 of the conductive pillar to the pitch S2 in the Y direction ranges from about 1/3 to about 2/3. In some embodiments, the pitch S1 in the X direction is substantially the same as the pitch S2 in the Y direction. In some embodiments, the pitch S1 in the X direction is greater than the pitch S2 in the Y direction. In some embodiments, the pitch S1 in the X direction is less than the pitch S2 in the Y direction.

Figure 24:
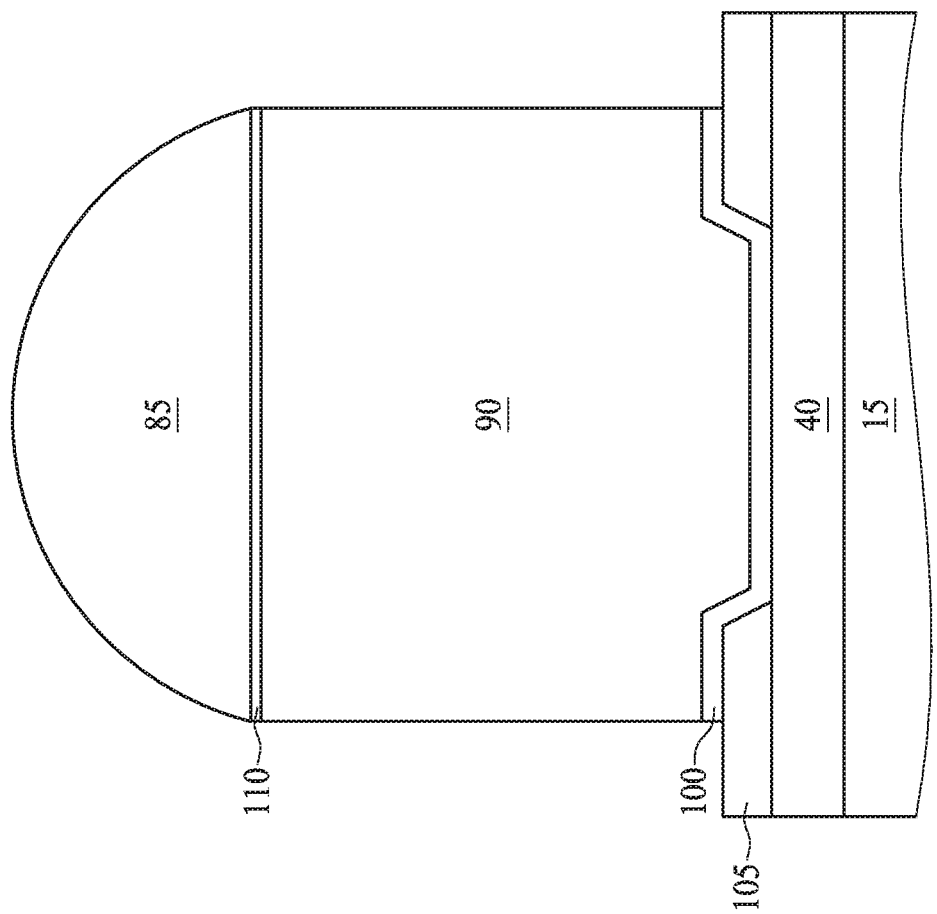
FIG. 24 is a detailed view of a pillar according to an embodiment of the present disclosure.

In some embodiments, a finish layer 110 is formed over the conductive pillar 90, as shown in FIG. 24. After forming the finish layer 110, the solder layer 85 is formed over the finish layer 110. In some embodiments, the finish layer 110 is a metal layer. The finish layer 110 may be formed of nickel, although other metals may be added. In some embodiments, the finish layer 110 is formed of electroless nickel electroless palladium immersion gold (ENEPIG), which includes a nickel layer, a palladium layer on the nickel layer, and a gold layer on the palladium layer. The gold layer may be formed using immersion plating. In other embodiments, the finish layer 110 is formed of other known finish materials and methods, including, but not limited to, electroless nickel immersion gold (ENIG), direct immersion gold (DIG), or the like. In some embodiments, the finish layer is substantially copper free. As used herein, substantially copper free means that if there is any copper in the finish layer it is only present at impurity levels. Methods of forming the finish layer 110 include electroless plating, immersion, and the like. The finish layer 110 forms a large interface area with underlying conductive pillar 90, thereby improving bonding between conductive pillar 90 and the solder layer 85. In some embodiments, the finish layer 110 has a thickness ranging from about 5 nm to about 100 nm.

Figure 25:
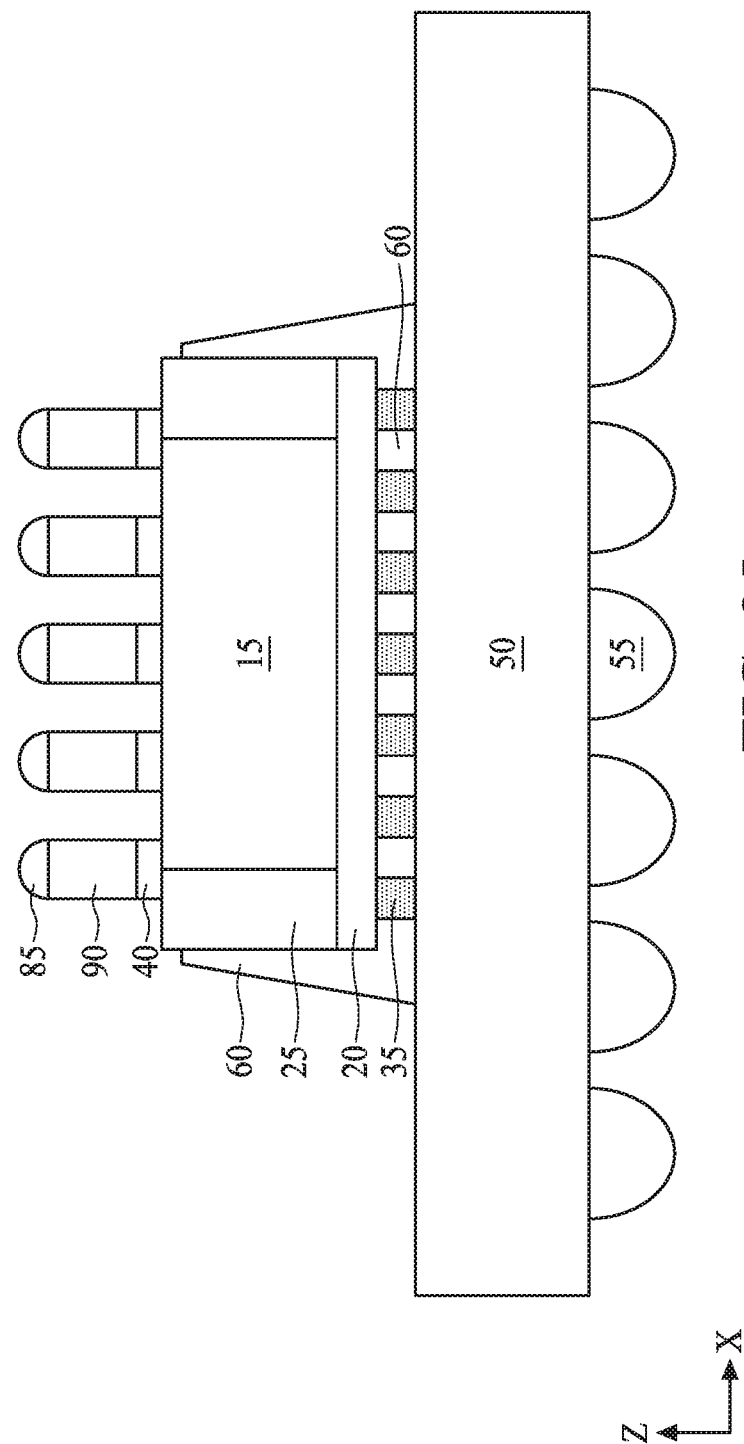
FIG. 25 illustrates a sequential step of manufacturing a semiconductor device according to an embodiment of the present disclosure.

In some embodiments, an underfill material 60 is formed between the chip 15 and the substrate 50, as shown in FIG. 25. The underfill material 60 fills the region between the solder bumps 35 on the redistribution layer 20. In some embodiments, the underfill material 60 is also disposed over the sides of the chip 15. In some embodiments, the underfill material 60 is an epoxy resin, such as a silica filled epoxy resin, a polyimide, or other suitable insulating material. The underfill material 60 increases mechanical reliability by distributing stresses across the top of the ball grid array substrate 50 rather than allowing them to become concentrated in the solder bumps 35. In addition, the underfill material 60 provides encapsulation from moisture and contaminants in the external environment.

Figure 26:
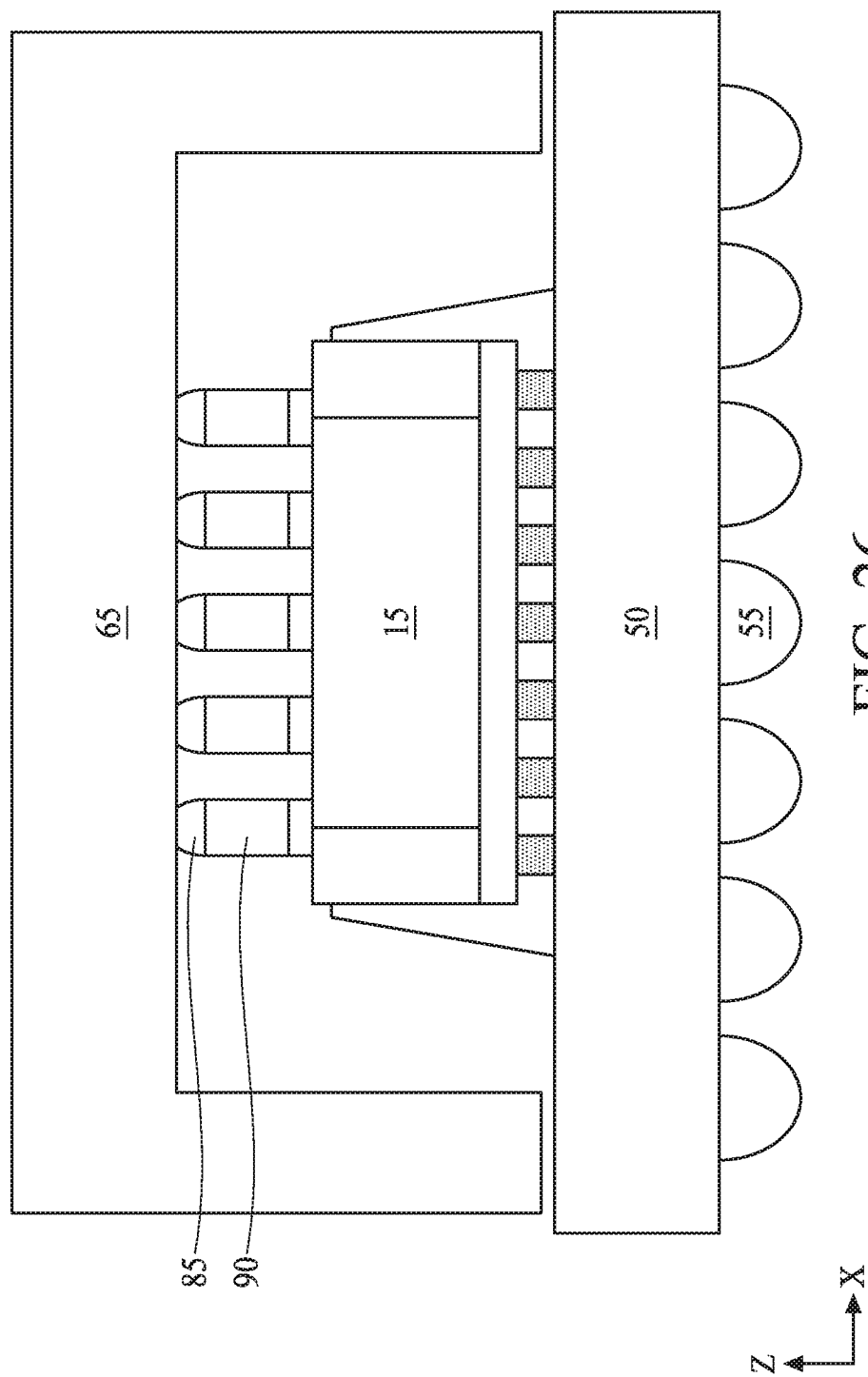
FIG. 26 illustrates a sequential step of manufacturing a semiconductor device according to an embodiment of the present disclosure.

A lid 65 is subsequently positioned over the solder layer 45, as shown in FIG. 26. The lid 65 functions as a heat sink to dissipate heat generated by the chip 15. The lid 65 is made of a heat conductive material. In some embodiments, the lid is made of aluminum, copper, nickel, cobalt, and alloys thereof, or other thermally conductive materials.

Figure 27:
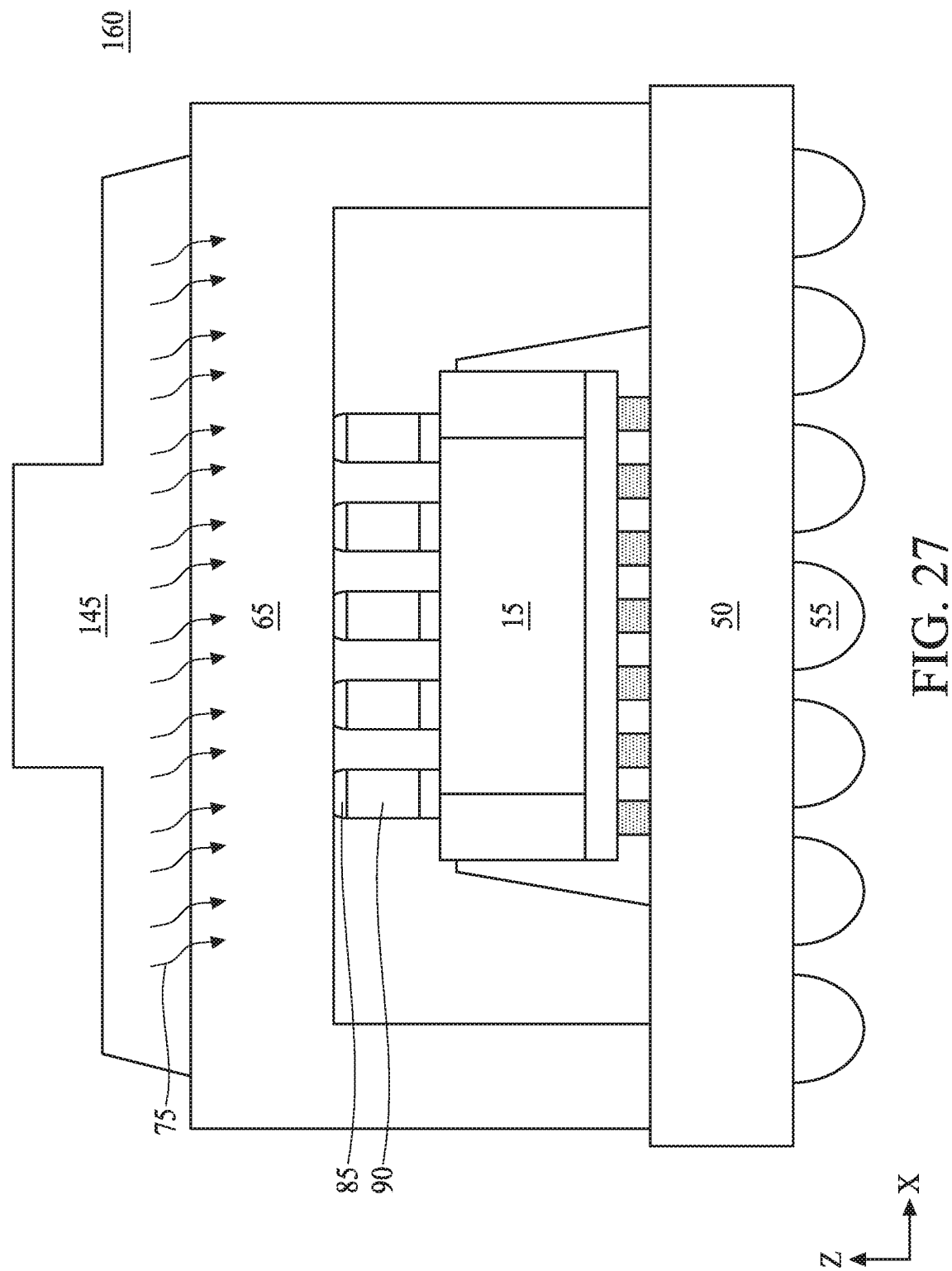
FIG. 27 illustrates a sequential step of manufacturing a semiconductor device according to an embodiment of the present disclosure.
Figure 28:
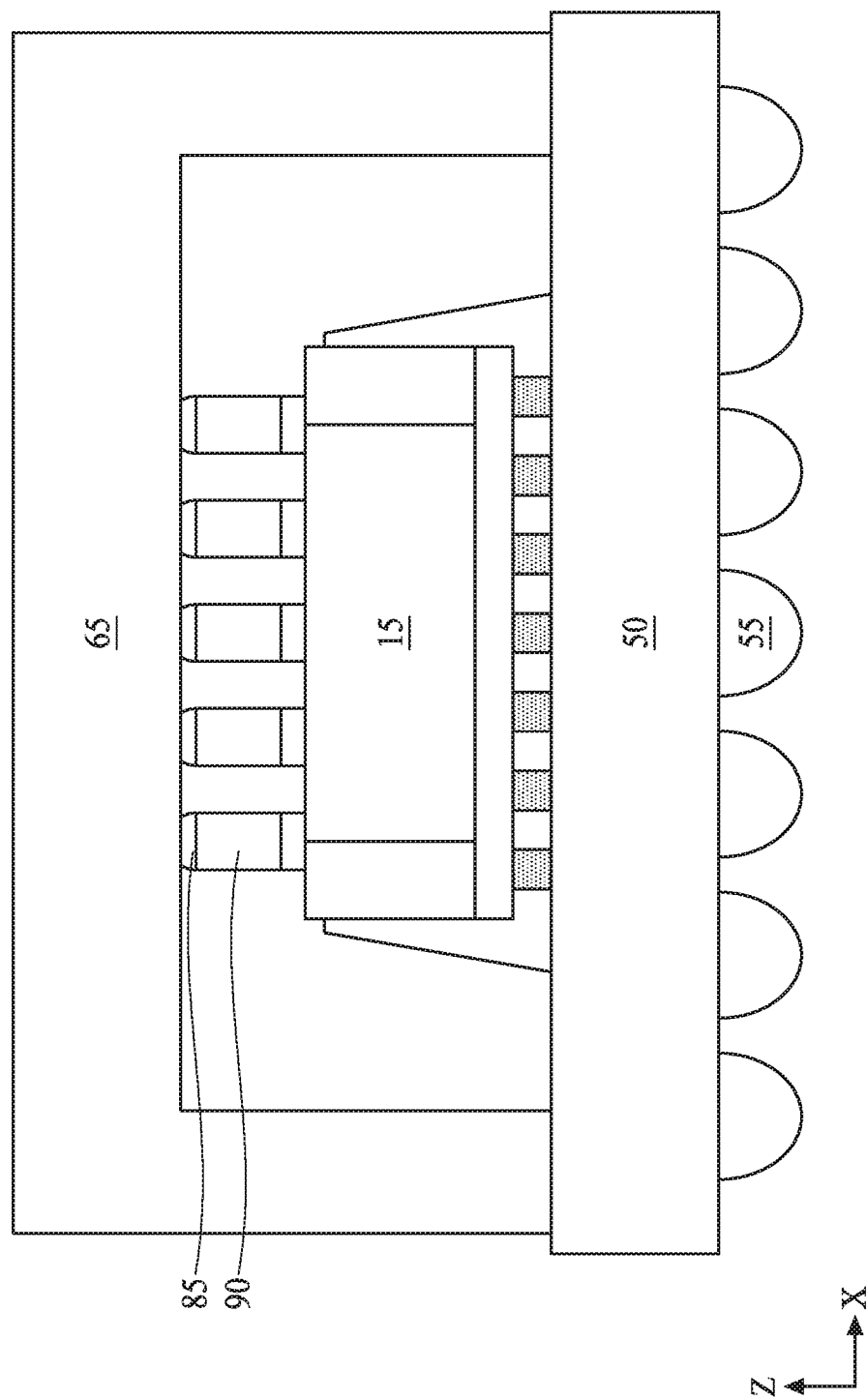
FIG. 28 illustrates a sequential step of manufacturing a semiconductor device according to an embodiment of the present disclosure.

Then, the lid 65 is heated and pressed into intimate contact with the chip 15 via the solder layer 45, such as by using a thermal compressive bond head 145, as shown in FIG. 27, thereby resulting in a semiconductor device with the lid 65 bonded to chip 15, as shown in FIG. 28. In some embodiments, the thermal compressive bond head 145 heats the solder layer 85 to a temperature of about 150° C. to about 400° C. In some embodiments, the solder layer 85 is heated to a temperature of about 200° C. to about 300° C. In an embodiment, the solder layer 85 is heated to a temperature of about 250° C. During the application of the heat and pressure 75 to the lid 65, the solder layer 85 flows, and the solder layer 85 subsequently hardens and fixedly adheres the lid 65 to the chip 15 upon cooling. The solder layer 85 functions as an improved thermal interface material (TIM) layer that has greater thermal conductivity than conventional thermal interface materials. Heat from the chip 15 is transferred to the lid 65 by way of the solder layer 85. The lid 65 dissipates the heat of chip 15, permitting the chip 15 to operate at higher speeds and with less thermal stress.

Figure 29:
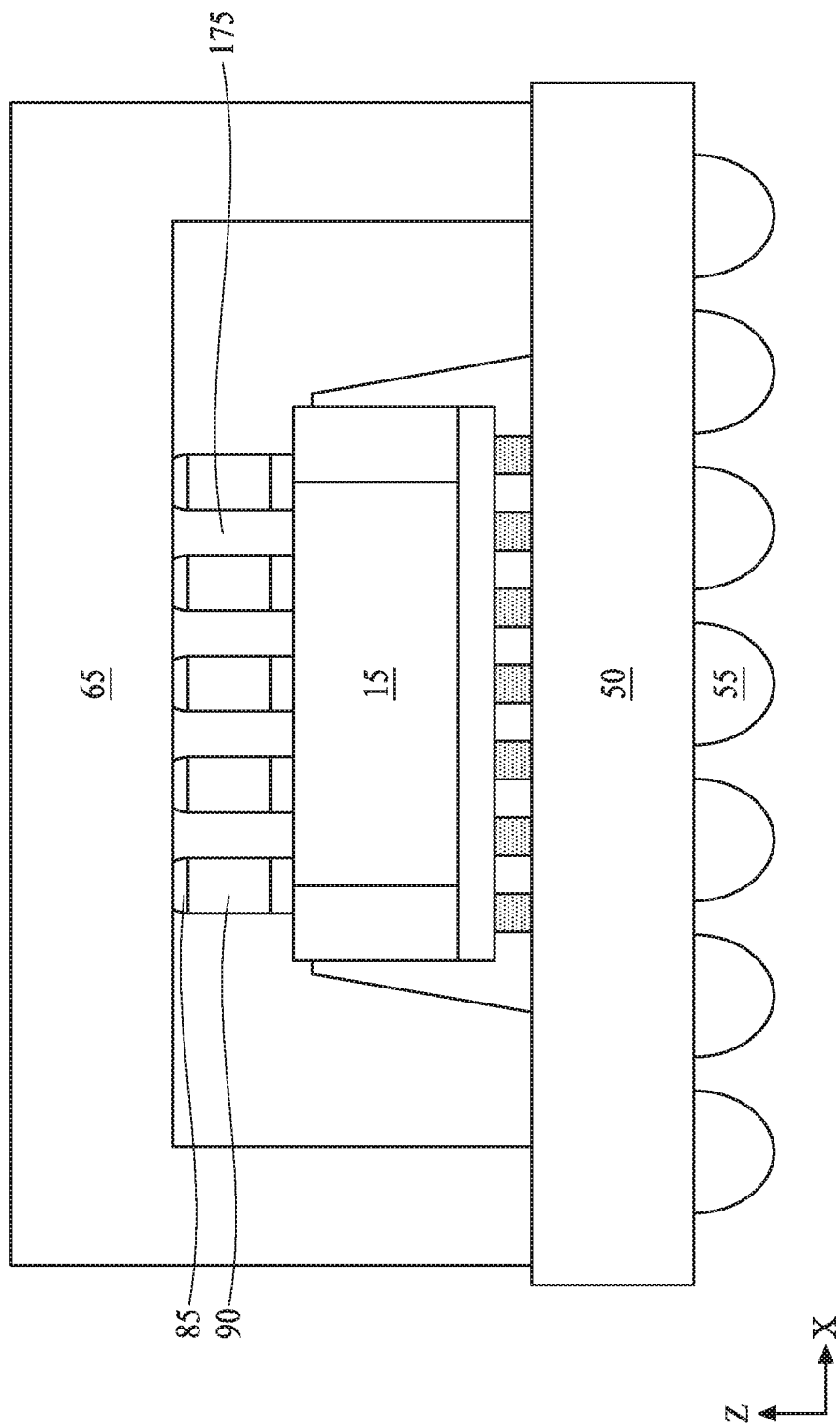
FIG. 29 illustrates a sequential step of manufacturing a semiconductor device according to an embodiment of the present disclosure.

In some embodiments, a thermal interface material (TIM) 175 is inserted between the conductive pillars 90 to assist in the thermal dissipation, as shown in FIG. 29. In some embodiments, the thermal interface material 175 is thermally conductive gel, paste, pad, grease, or phase change materials with thermal conductivities, between about 0.5 W/mK and 10 W/mK. In some embodiments, the thermal grease may be a ceramic or metal, such as beryllium oxide, aluminum nitride, aluminum oxide, zinc oxide, silver, aluminum, or the like, suspended in a silicone-based gel. In some embodiments, the thermal interface material is a liquid metal paste of gallium alloys, or a metal alloy pad that is reflowed to adhere the thermal interface material to a surface. In some embodiments, the thermal interface material is a non-electrically conductive, ceramic-based paste filled with ceramic powders, such as beryllium oxide, aluminum nitride, aluminum oxide, or zinc oxide.

Figure 30:
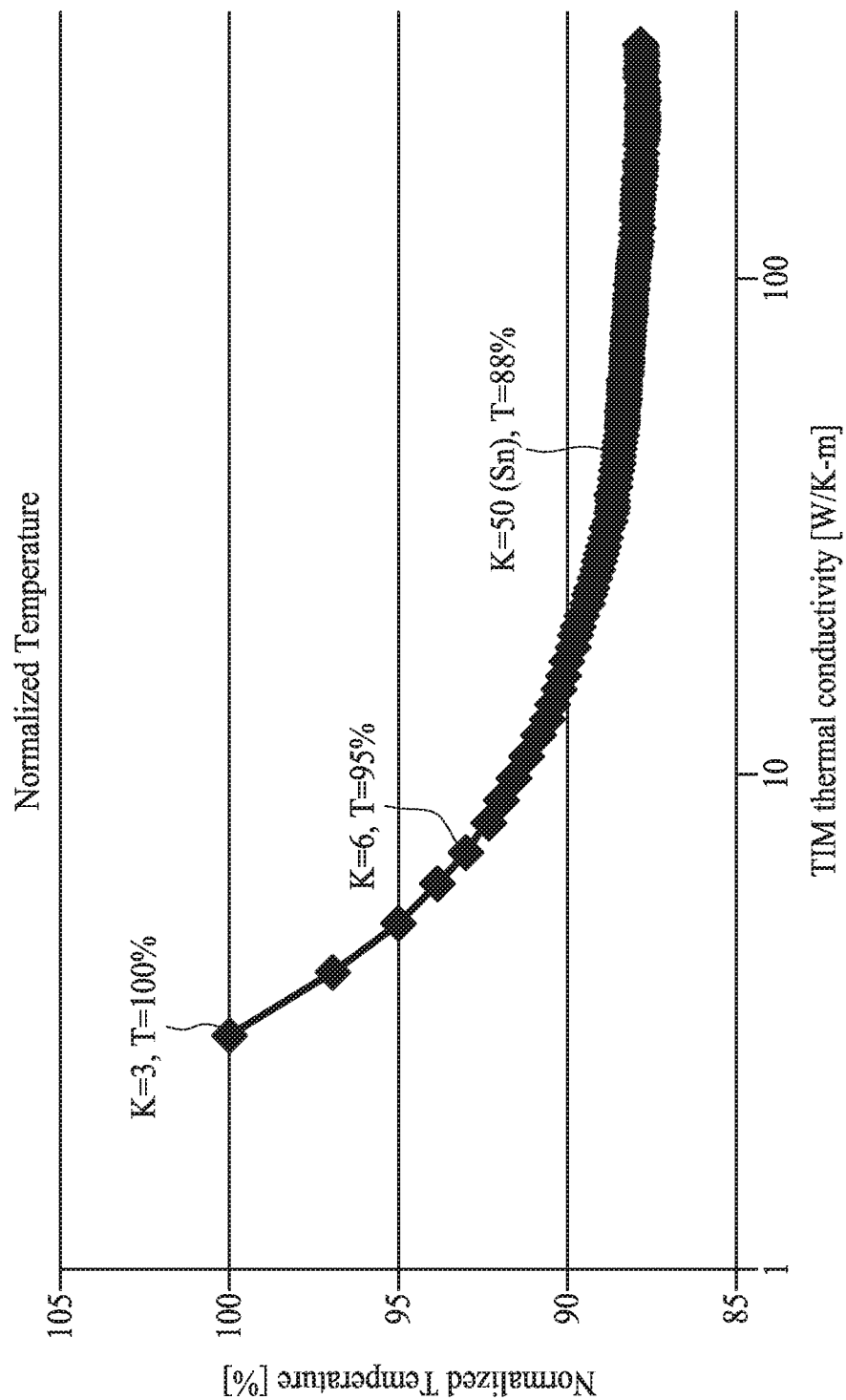
FIG. 30 shows a graph plotting the thermal conductivity of a material versus a normalized temperature.

FIG. 30 is a thermal simulation showing the normalized operation temperature of a system on chip (SOC) using a thermal interface material with a selected thermal conductivity. The simulation is based on a system on a chip power of 300 W and forced air convection on the lid surface. The thermal simulation shows that increasing the thermal conductivity from K=3 W/mK to 6 W/mK using a conventional thermal interface material only reduces the operating temperature of the SOC about 5%. On the other hand, using a conductive metal according to embodiments of the present disclosure, such as Sn having a thermal conductivity of about 50 W/mK the operating temperature of the SOC is reduced to about 88% of its normalized value. Thus, the methods and devices of the present disclosure provides a greater than 200% improvement in heat transfer than conventional methods and devices in some embodiments.

Embodiments of the present disclosure use materials containing high thermal conductivity metals e.g.—Cu ($K_{Cu}$~400 W/mK) and Sn ($K_{Sn}$~65 W/mK) to provide a solder-based thermal interface material having thermal conductivities which are superior to a conventional thermal interface material (<10 W/mK). In some embodiments, the solder has a thermal conductivity of ≥50 W/mK. By using high thermal conductivity materials between the chip and the lid, the operation power and performance can be significantly increased without substantial changes to the semiconductor device structure and without any negative impact on device performance.

An embodiment of the disclosure is a method, including forming a solder layer on a surface of one or more chips and positioning a lid over the solder layer on each of the one or more chips. Heat and pressure are applied to melt the solder layer and attach each lid to a corresponding chip via the solder layer. The solder layer has a thermal conductivity of ≥50 W/mK. In an embodiment, the method includes forming an integrated fan-out wafer on a frame, wherein the integrated fan-out wafer includes the one or more chips, before forming the solder layer on the surface of the one or more chips. In an embodiment, the solder layer is a patterned solder layer. In an embodiment, the patterned solder layer includes a plurality of spaced-apart solder regions. In an embodiment, the method includes forming a plurality of bonding pads on the surface of the one or more chips before forming the solder layer. In an embodiment, the method includes forming a metal pillar on each of the plurality of bonding pads before forming the solder layer, wherein the solder layer comprises solder balls formed on each of the metal pillars. In an embodiment, the pillar is formed mainly of a metal selected from the group consisting of aluminum, copper, chromium, iron, manganese, magnesium, molybdenum, nickel, niobium, tantalum, titanium, tungsten, zinc, and alloys thereof. In an embodiment, the method includes forming a thermal interface material between the lid and the surface of the chip. In an embodiment, the method includes separating the one or more chips before positioning the lids. In an embodiment, the method includes removing the one or more chips from the frame; and attaching the one or more chips to a substrate, wherein the removing and attaching the one or more chips is performed before positioning the lids. In an embodiment, the method includes forming an underfill layer between the one or more chips and the substrate. In an embodiment, the heat and pressure are applied to each lid. In an embodiment, a thermal compressive bond head is used to apply the heat and pressure to each lid.

Another embodiment of the disclosure is a method, including forming a metal pillar on each of a plurality of bonding pads disposed on a main surface of a chip and forming a solder layer on each of the metal pillars. A lid is positioned over the solder layer on each of the metal pillars and heat and pressure are applied to melt the solder layer and attach the lid to the chip via the solder layer. In an embodiment, the solder layer comprises solder balls formed on each of the metal pillars. In an embodiment, the pillar is formed mainly of a metal selected from the group consisting of aluminum, copper, chromium, iron, manganese, magnesium, molybdenum, nickel, niobium, tantalum, titanium, tungsten, zinc, and alloys thereof. In an embodiment, the method includes forming an integrated fan-out wafer on a frame, wherein the integrated fan-out wafer includes the chip, before forming the metal pillars.

Another embodiment of the disclosure is method, forming a solder bump comprising a solder on each of a plurality of bonding pads disposed on a main surface of a chip. A lid is positioned over solder bumps formed on each of the plurality bonding pads. Heat and pressure are applied to melt the solder bumps, causing the solder to flow, and the solder bumps to merge forming a solder layer. The lid is fixedly attached to the chip via the solder layer. In an embodiment, the method includes forming an integrated fan-out wafer on a frame, wherein the integrated fan-out wafer includes the chip, before forming the solder bumps on the main surface of the chip. In an embodiment, the solder comprises a material having a thermal conductivity of ≥50 W/mK.

Another embodiment of the disclosure is a semiconductor device, including a chip disposed over a substrate. A solder layer is disposed over a surface of the chip, and a lid is attached to the chip via the solder layer. In an embodiment, the chip is an integrated fan-out chip, system on a chip, wafer-level chip scale package, or chip on wafer on substrate. In an embodiment, the device includes an underfill layer between the chip and the substrate. In an embodiment, the solder layer is a patterned solder layer. In an embodiment, the patterned solder layer includes a plurality of spaced-apart solder regions. In an embodiment, the semiconductor device includes a plurality of bonding pads between the surface of the one or more chips and the solder layer. In an embodiment, the semiconductor device includes a metal pillar disposed between each of the bonding pads and the solder layer. In an embodiment, the metal pillars comprise copper or nickel. In an embodiment, the semiconductor device includes a thermal interface material between the lid and the chip.

Another embodiment of the disclosure is a semiconductor device, including a chip disposed over a substrate and a plurality of bonding pads disposed on a main surface of a chip. A plurality of metal pillars are disposed on the bonding pads, wherein each bonding pad has a pillar disposed thereon. A solder layer is disposed over a surface of each metal pillar and a lid is attached to the chip via the solder layer. In an embodiment, the chip is an integrated fan-out chip, system on a chip, wafer-level chip scale package, or chip on wafer on substrate. In an embodiment, the semiconductor device includes an underfill layer between the chip and the substrate. In an embodiment, the semiconductor device includes a seed layer between each of the plurality of bonding pads and each of the plurality of pillars. In an embodiment, the pillar is formed of a metal selected from the group consisting of aluminum, copper, chromium, iron, manganese, magnesium, molybdenum, nickel, niobium, tantalum, titanium, tungsten, zinc, and alloys thereof. In an embodiment, the semiconductor device includes a thermal interface material between the lid and the chip.

Another embodiment of the disclosure is a semiconductor device, including a chip disposed over a first main surface of a substrate. First solder bumps connect the chip to the first main surface of the substrate. Second solder bumps are disposed on a second main surface of the substrate. Conductive vias in the substrate connect the first solder bumps to the second solder bumps. A plurality of bonding pads are disposed on a first main surface of the chip. A solder layer is disposed over the plurality of bonding pads and the first main surface of the chip. A lid is in contact with the substrate and attached to the chip via the solder layer. In an embodiment, the chip is an integrated fan-out chip, system on a chip, wafer-level chip scale package, or chip on wafer on substrate. In an embodiment, the semiconductor device includes an underfill layer between the chip and the substrate. In an embodiment, the solder includes a material having a thermal conductivity of ≥50 W/mK. In an embodiment, the solder is selected from the group consisting of PbSn, AgSn, SnAgCu, CuSnNi, AgCuSbSn, AuSn, and CuSn.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an integrated fan-out wafer on a frame, wherein the integrated fan-out wafer includes a plurality of chips disposed on a redistribution layer;
   forming a metal pillar over a main surface of each of the plurality of chips;
   forming a solder layer on each of the metal pillars;
   separating the plurality of chips by a sawing operation after forming the solder layer;
   bonding a lid to each of the plurality of chips via the solder layer after separating the plurality of chips;
   applying heat and pressure to melt the solder layer and attach each lid to a corresponding chip via the solder layer and metal pillars; and
   forming a thermal interface material layer between each of the metal pillars and between the main surface of the chip and the lid,
   wherein the solder and thermal interface material are different materials, and
   wherein the solder layer has a thermal conductivity of ≥50 W/mK.

2. The method according to claim 1, further comprising forming a bonding pad on the main surface of each of the plurality of chips before forming the metal pillar.

3. The method according to claim 1, wherein the solder layer comprises solder balls formed on each of the metal pillars.

4. The method according to claim 1, wherein the metal pillars are formed of copper.

5. The method according to claim 1, further comprising:
   removing the plurality of chips from the frame; and
   attaching the plurality of chips to a substrate,
   wherein the removing and attaching the plurality of chips is performed before positioning the lids.

6. The method according to claim 5, further comprising forming an underfill layer between the plurality of chips and the substrate.

7. The method according to claim 1, wherein the heat and pressure are applied to each lid.

8. The method according to claim 7, wherein a thermal compressive bond head is used to apply the heat and pressure to each lid.

9. A method, comprising:
   forming an integrated fan-out wafer on a frame, wherein the integrated fan-out wafer includes a chip disposed on a redistribution layer;
   forming a metal pillar on each of a plurality of bonding pads disposed on a main surface of the chip;
   forming a solder layer on each of the metal pillars;
   forming a thermal interface material layer between each of the metal pillars between the lid and the surface of the chip,
   wherein the solder and thermal interface material are different materials;
   positioning a lid over the solder layer on each of the metal pillars; and
   applying heat and pressure to melt the solder layer and attach the lid to the chip via the solder layer.

10. The method according to claim 9, wherein the solder layer comprises solder balls formed on each of the metal pillars.

11. The method according to claim 9, wherein the metal pillars are formed of copper or nickel.

12. A method, comprising:
    forming an integrated fan-out wafer on a frame, wherein the integrated fan-out wafer includes a chip disposed on a redistribution layer;
    forming a solder bump comprising a solder on each of a plurality of bonding pads disposed on a main surface of the chip,
    wherein the solder bumps are made of a tin-containing alloy and are spaced apart from each other;
    positioning a lid over solder bumps formed on each of the plurality bonding pads;
    applying heat and pressure to melt the solder bumps, causing the solder to flow, and adjacent spaced-apart solder bumps to merge with each other forming a solder layer; and
    fixedly attaching the lid to the chip via the solder layer.

13. The method according to claim 12, wherein the solder comprises a material having a thermal conductivity of ≥50 W/mK.

14. The method according to claim 9, wherein the solder layer is made of a tin-containing alloy.

15. The method according to claim 1, wherein the solder layer is made of a tin-containing alloy.

16. The method according to claim 9, wherein a thermal compressive bond head is used to apply the heat and pressure to the lid.

17. The method according to claim 1, wherein the solder layer is made of a tin-containing alloy.

18. The method according to claim 17, wherein the thermal interface material is non-electrically conductive.

19. The method according to claim 17, wherein the thermal interface material is a thermally conductive pad, phase change material, or ceramic-containing grease or paste.

20. The method according to claim 9, wherein the thermal interface material is non-electrically conductive.

* * * * *